US009742435B1

United States Patent
Poghosyan et al.

(10) Patent No.: US 9,742,435 B1
(45) Date of Patent: Aug. 22, 2017

(54) MULTI-STAGE DATA COMPRESSION FOR TIME-SERIES METRIC DATA WITHIN COMPUTER SYSTEMS

(71) Applicant: VMware, Inc., Palo Alto, CA (US)

(72) Inventors: Arnak Poghosyan, Yerevan (AM); Ashot Nshan Harutyunyan, Yerevan (AM); Naira Movses Grigoryan, Yerevan (AM); Vahe Khachikyan, Yerevan (AM); Meruzhan Kerobyan, Yerevan (AM)

(73) Assignee: VMware, Inc., Palo Alto, CA (US)

( * ) Notice: Subject to any disclaimer, the term of this patent is extended or adjusted under 35 U.S.C. 154(b) by 0 days.

(21) Appl. No.: 15/188,834

(22) Filed: Jun. 21, 2016

(51) Int. Cl.
*H03M 7/34* (2006.01)
*H03M 7/30* (2006.01)
*H03M 7/40* (2006.01)
*H03M 7/46* (2006.01)
*H04L 29/08* (2006.01)

(52) U.S. Cl.
CPC .......... *H03M 7/3082* (2013.01); *H03M 7/40* (2013.01); *H03M 7/46* (2013.01); *H03M 7/30* (2013.01); *H04L 29/08072* (2013.01); *H04L 29/08144* (2013.01)

(58) Field of Classification Search
CPC ............... H03M 7/30; H04L 29/08144; H04L 29/08072
USPC ............. 341/51, 50; 709/226, 224, 217, 201
See application file for complete search history.

(56) References Cited

U.S. PATENT DOCUMENTS

2016/0323157 A1* 11/2016 Marvasti ................ H04L 43/04

* cited by examiner

*Primary Examiner* — Joseph Lauture

(57) ABSTRACT

The current document is directed to a multi-stage metric-data compression method and subsystem for compressing metric data collected and stored within distributed computing systems to facilitate computer-system management and administration. In a described implementation, metric data is partitioned into constant metric data, low-variability metric data, and high-variability metric data. High-variability metric data is compressed by identifying a set of basis metrics, or independent metrics, with respect to which a remaining set of dependent metrics can be expressed using coefficient multipliers. The high-variability metric data can then be stored as a set of independent metrics and set of coefficients, along with a small amount of additional data.

20 Claims, 29 Drawing Sheets

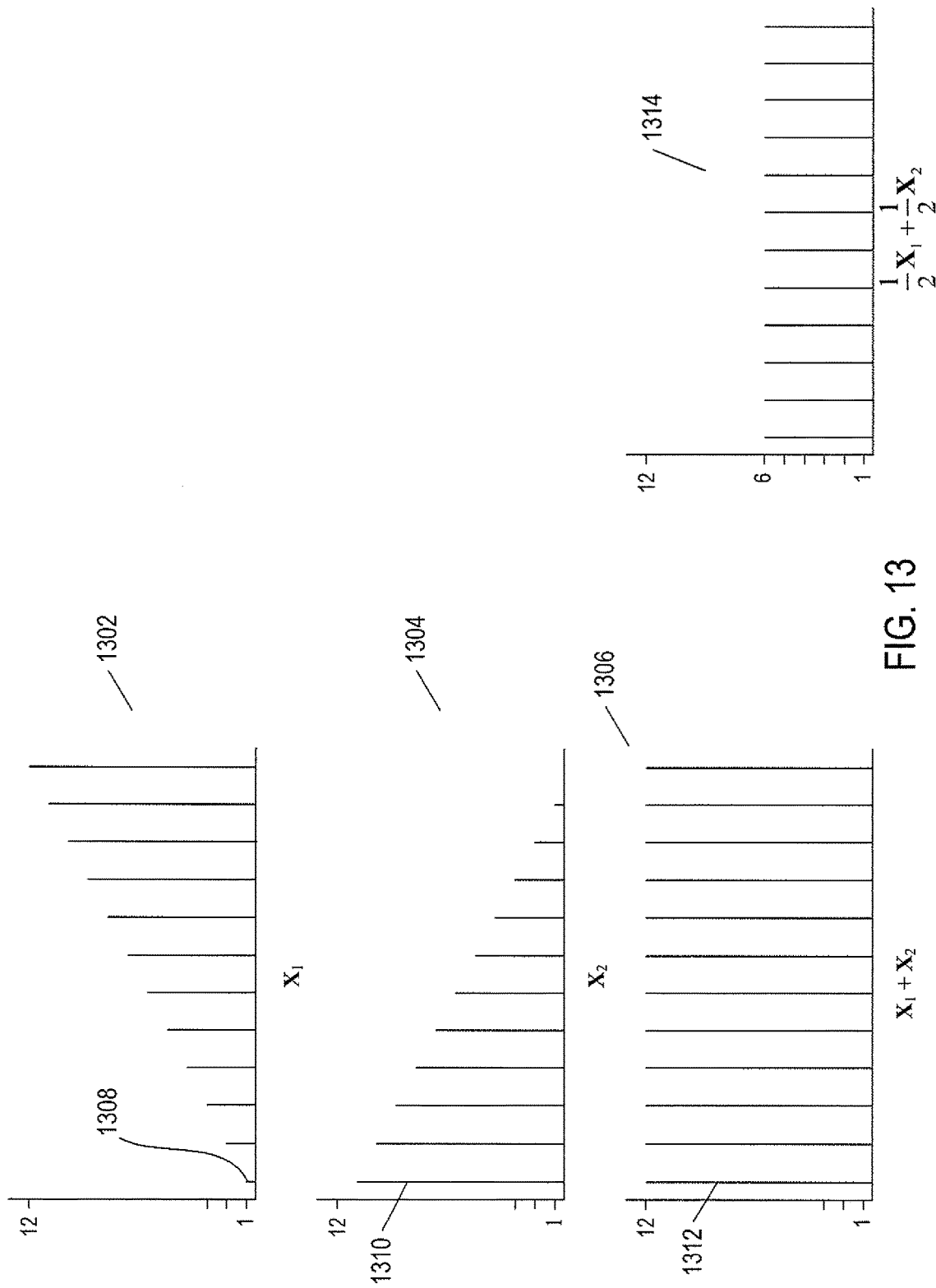

$Cv = \lambda v$ —— 2320
where $v$ = eigenvector of $C$; and
$\lambda$ = eigenvalue of $C$.

$Cv - \lambda v = 0$ —— 2322
$(C - \lambda I)v = 0$
$\det(C - \lambda I) = 0 \rightarrow (\lambda_1 - \lambda)(\lambda_2 - \lambda)\cdots(\lambda_p - \lambda)$ —— 2324

$V = [[v_1][v_2][v_3]\cdots[v_s]]$ —— 2326

$$D = V^{-1}CV = \begin{bmatrix} \lambda_1 & & & & \\ & \lambda_2 & & & \\ & & \lambda_3 & & \\ & & & \lambda_4 & \\ & & & & \ddots \\ & & & & & \lambda_s \end{bmatrix}$$ —— 2328

$$D' = \begin{bmatrix} \lambda'_1 & & & & \\ & \lambda'_2 & & & \\ & & \lambda'_3 & & \\ & & & \lambda'_4 & \\ & & & & \ddots \\ & & & & & \lambda'_s \end{bmatrix}$$ where each $\lambda'_i \in \{\lambda_i\}$ and $\lambda'_1 \geq \lambda'_2 \geq \lambda'_3 \cdots \geq \lambda'_s$ —— 2330

$V' = [[v'_1][v'_2][v'_3]\cdots[v'_s]]$ —— 2331

FIG. 23

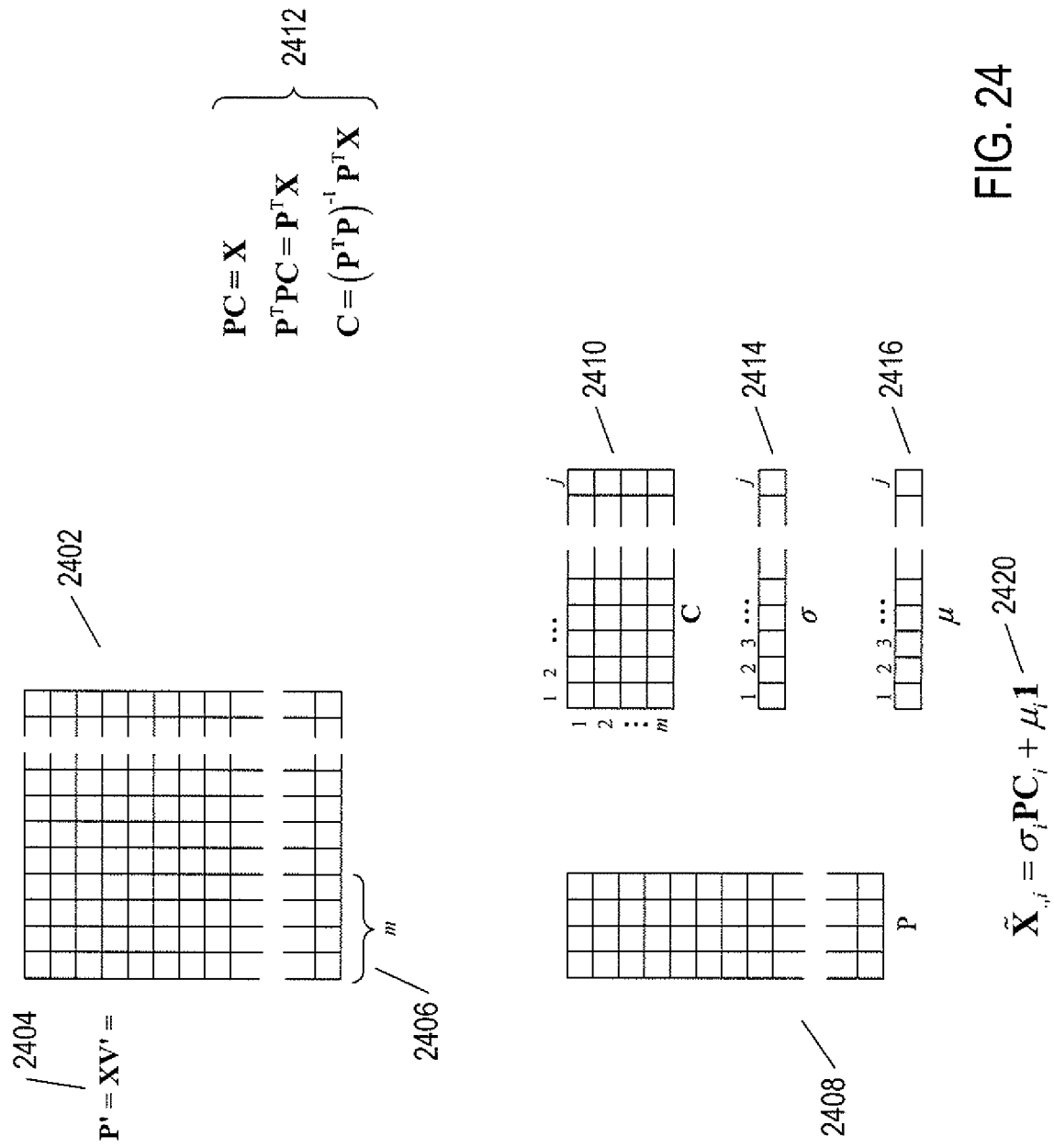

MULTI-STAGE DATA COMPRESSION FOR TIME-SERIES METRIC DATA WITHIN COMPUTER SYSTEMS

TECHNICAL FIELD

The current document is directed to data compression and computer-system management and administration, and, in particular, to a multi-stage data-compression method and subsystem for compressing metric data within computer systems.

BACKGROUND

Computer systems have evolved enormously in the past 60 years. Initial computer systems were room-sized, vacuum-tube-based behemoths with far less computational bandwidth and smaller data-storage capacities than a modern smart phone or even a microprocessor controller embedded in any of various consumer appliances and devices. Initial computer systems ran primitive programs one at a time, without the benefit of operating systems, high-level languages, and networking. Over time, parallel development of hardware, compilers, operating systems, virtualization technologies, and distributed-computing technologies has led to modern distributed computing systems, including cloud-computing facilities, that feature hundreds, thousands, tens of thousands, or more high-end servers, each including multiple multi-core processors, that can access remote computer systems and that can be accessed by remote client computers throughout the world through sophisticated electronic communications. As the complexity of computer systems has grown, the administration and management of computer systems has exponentially grown in complexity, in the volume of data generated and stored for administration and management purposes, and in the computational-bandwidth used for collecting and processing data that reflects the internal operational state of the computer systems and their subsystems and components. While the operational state of an early computer system may well have been encapsulated in a handful of status registers and a modest amount of information printed from teletype consoles, gigabytes or terabytes of metric data may be generated and stored by internal automated monitoring, administration, and management subsystems within a modern distributed computing system on a daily or weekly basis. Storage and processing of these large volumes of data generated by automated monitoring, administration, and maintenance subsystems within distributed computing systems is rapidly becoming a computational bottleneck with respect to further evolution, expansion, and improvement of distributed computing systems. For this reason, designers, developers, vendors, and, ultimately, users of computer systems continue to seek methods and subsystems to more efficiently store, process, and interpret the voluminous amount of metric data internally generated within distributed computing systems to facilitate automated administration and management of distributed computing systems, including diagnosing performance and operational problems, anticipating such problems, and automatically reconfiguring and repairing distributed-system-components to address identified and anticipated problems.

SUMMARY

The current document is directed to a multi-stage metric-data compression method and subsystem for compressing metric data collected and stored within distributed computing systems to facilitate computer-system management and administration. In a described implementation, metric data is partitioned into constant metric data, low-variability metric data, and high-variability metric data. High-variability metric data is compressed by identifying a set of basis metrics, or independent metrics, with respect to which a remaining set of dependent metrics can be expressed using coefficient multipliers. The high-variability metric data can then be stored as a set of independent metrics and set of coefficients, along with a small amount of additional data.

BRIEF DESCRIPTION OF THE DRAWINGS

FIG. 13 illustrates linear combination of two different metrics.

FIGS. 22-24 illustrate the principle-component-analysis method for determining a set of basis vectors.

DETAILED DESCRIPTION

The current document is directed to a method and subsystem for compressing metric data within a computer system. In a first subsection, below, an overview of distributed computing systems is provided, with reference to FIGS. 1-10. In a second subsection, the methods and subsystems to which the current document is directed are discussed, with reference to FIGS. 11-25C.

Overview of Distributed Computing Systems

Figure 1:
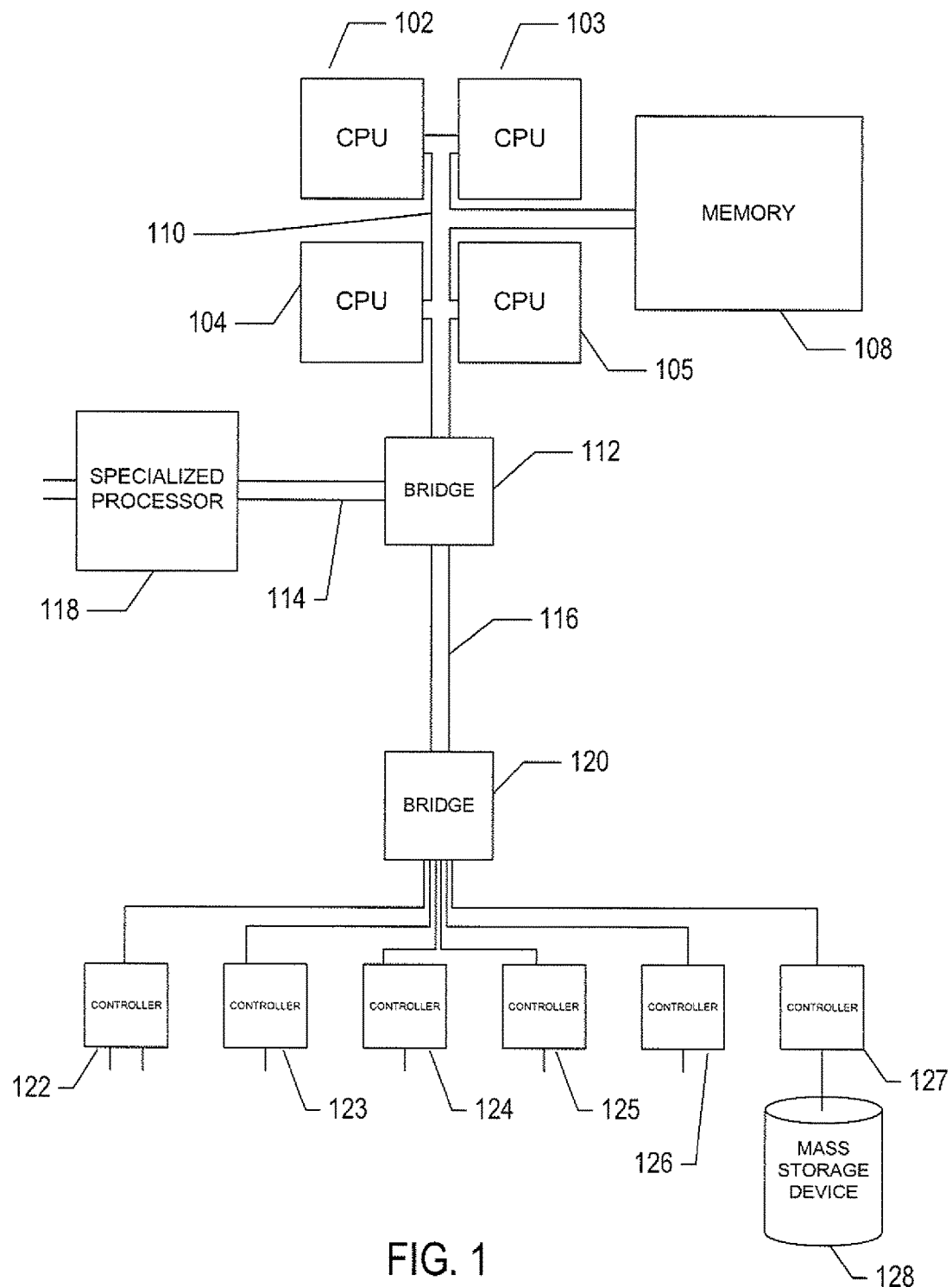
FIG. 1 provides a general architectural diagram for various types of computers.

FIG. 1 provides a general architectural diagram for various types of computers. The computer system contains one or multiple central processing units ("CPUs") 102-105, one or more electronic memories 108 interconnected with the CPUs by a CPU/memory-subsystem bus 110 or multiple busses, a first bridge 112 that interconnects the CPU/memory-subsystem bus 110 with additional busses 114 and 116, or other types of high-speed interconnection media, including multiple, high-speed serial interconnects. These busses or serial interconnections, in turn, connect the CPUs and memory with specialized processors, such as a graphics processor 118, and with one or more additional bridges 120, which are interconnected with high-speed serial links or with multiple controllers 122-127, such as controller 127, that provide access to various different types of mass-storage devices 128, electronic displays, input devices, and other such components, subcomponents, and computational resources. It should be noted that computer-readable data-storage devices include optical and electromagnetic disks, electronic memories, and other physical data-storage devices. Those familiar with modern science and technology appreciate that electromagnetic radiation and propagating signals do not store data for subsequent retrieval, and can transiently "store" only a byte or less of information per mile, far less information than needed to encode even the simplest of routines.

Of course, there are many different types of computer-system architectures that differ from one another in the number of different memories, including different types of hierarchical cache memories, the number of processors and the connectivity of the processors with other system components, the number of internal communications busses and serial links, and in many other ways. However, computer systems generally execute stored programs by fetching instructions from memory and executing the instructions in one or more processors. Computer systems include general-purpose computer systems, such as personal computers ("PCs"), various types of servers and workstations, and higher-end mainframe computers, but may also include a plethora of various types of special-purpose computing devices, including data-storage systems, communications routers, network nodes, tablet computers, and mobile telephones.

Figure 2:
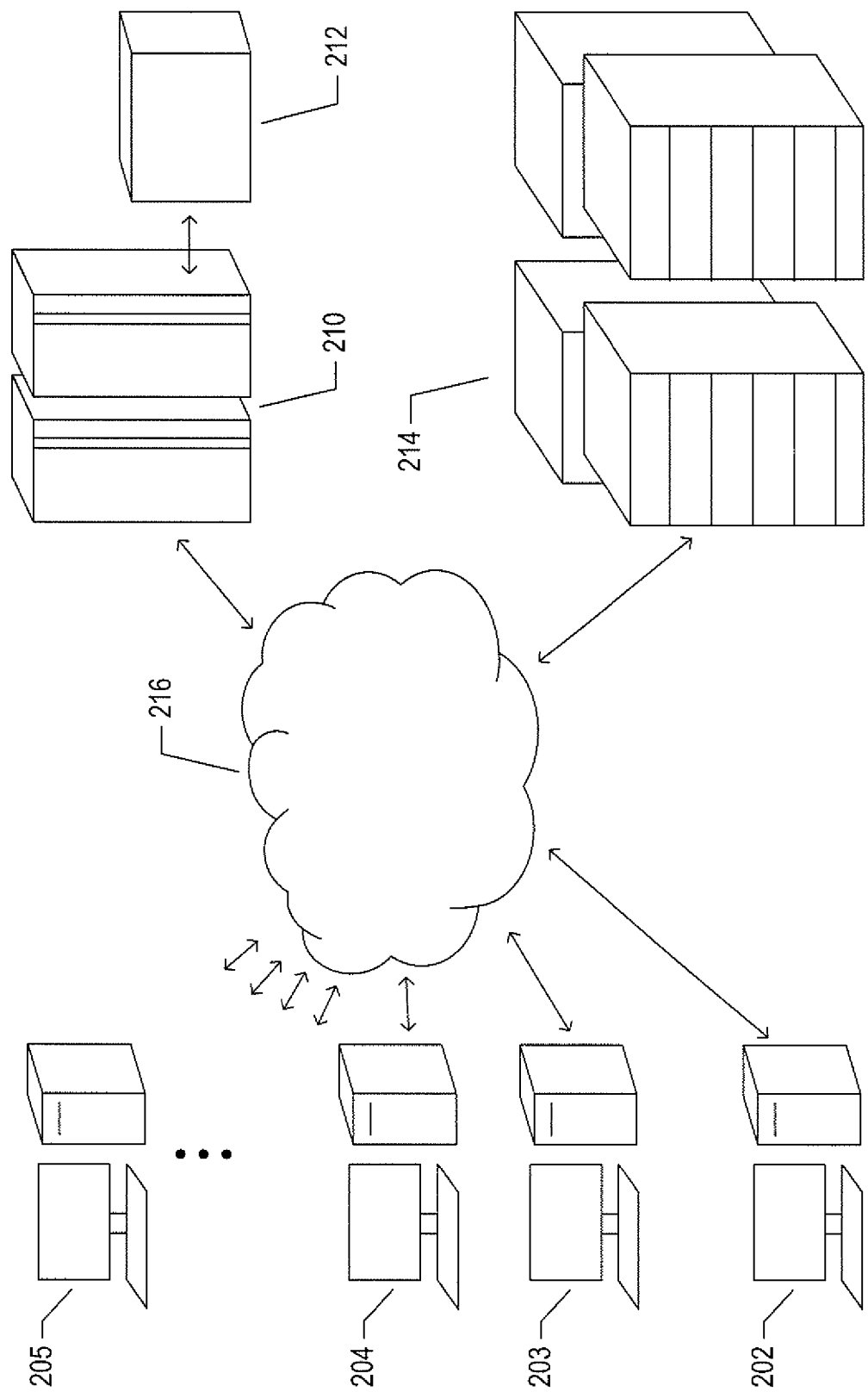
FIG. 2 illustrates an Internet-connected distributed computer system.

FIG. 2 illustrates an Internet-connected distributed computer system. As communications and networking technologies have evolved in capability and accessibility, and as the computational bandwidths, data-storage capacities, and other capabilities and capacities of various types of computer systems have steadily and rapidly increased, much of modern computing now generally involves large distributed systems and computers interconnected by local networks, wide-area networks, wireless communications, and the Internet. FIG. 2 shows a typical distributed system in which a large number of PCs 202-205, a high-end distributed mainframe system 210 with a large data-storage system 212, and a large computer center 214 with large numbers of rack-mounted servers or blade servers all interconnected through various communications and networking systems that together comprise the Internet 216. Such distributed computing systems provide diverse arrays of functionalities. For example, a PC user sitting in a home office may access hundreds of millions of different web sites provided by hundreds of thousands of different web servers throughout the world and may access high-computational-bandwidth computing services from remote computer facilities for running complex computational tasks.

Until recently, computational services were generally provided by computer systems and data centers purchased, configured, managed, and maintained by service-provider organizations. For example, an e-commerce retailer generally purchased, configured, managed, and maintained a data center including numerous web servers, back-end computer systems, and data-storage systems for serving web pages to remote customers, receiving orders through the web-page interface, processing the orders, tracking completed orders, and other myriad different tasks associated with an e-commerce enterprise.

Figure 3:
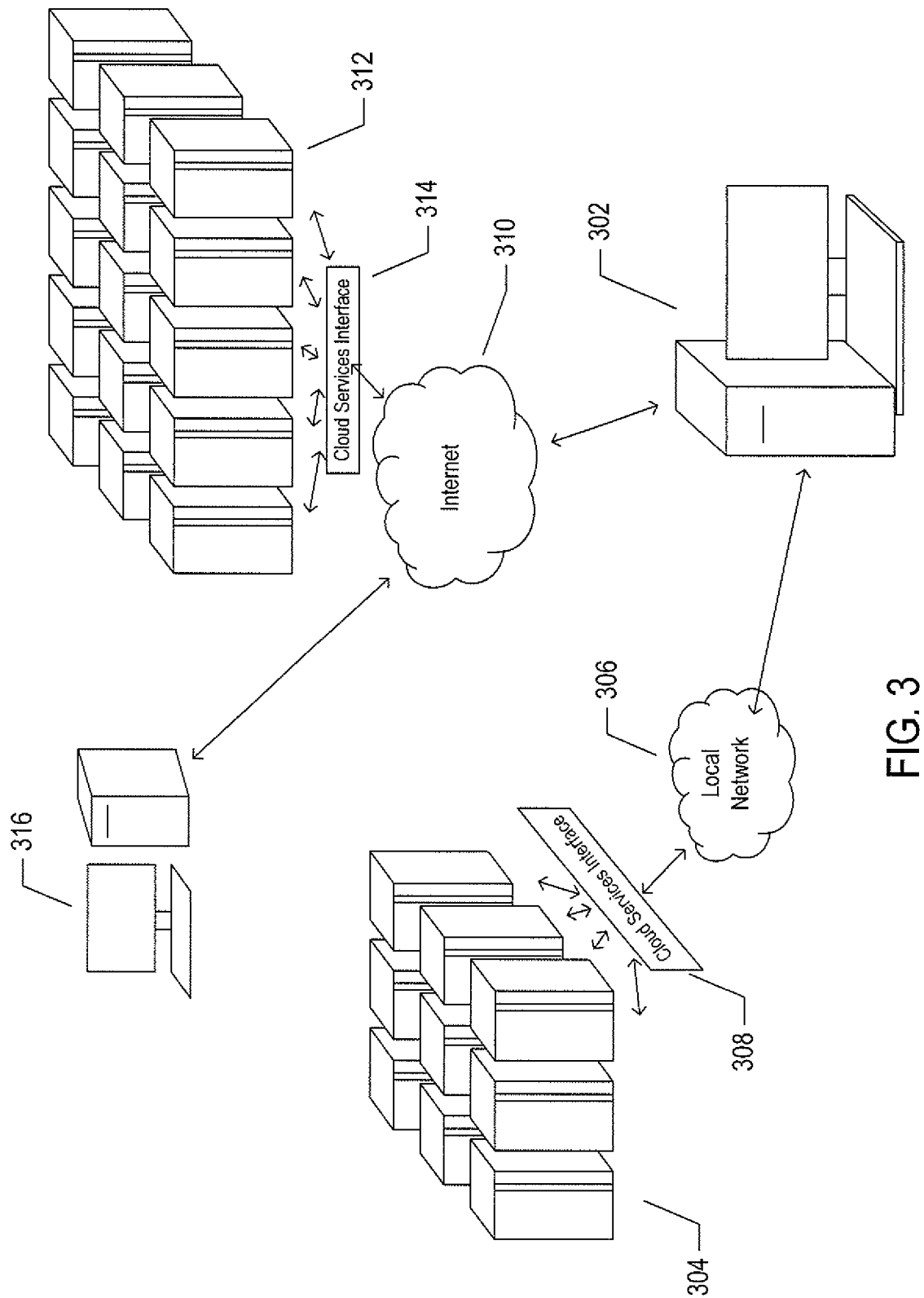
FIG. 3 illustrates cloud computing.

FIG. 3 illustrates cloud computing. In the recently developed cloud-computing paradigm, computing cycles and data-storage facilities are provided to organizations and individuals by cloud-computing providers. In addition, larger organizations may elect to establish private cloud-computing facilities in addition to, or instead of, subscribing to computing services provided by public cloud-computing service providers. In FIG. 3, a system administrator for an organization, using a PC 302, accesses the organization's private cloud 304 through a local network 306 and private-cloud interface 308 and also accesses, through the Internet 310, a public cloud 312 through a public-cloud services interface 314. The administrator can, in either the case of the private cloud 304 or public cloud 312, configure virtual computer systems and even entire virtual data centers and launch execution of application programs on the virtual computer systems and virtual data centers in order to carry out any of many different types of computational tasks. As one example, a small organization may configure and run a virtual data center within a public cloud that executes web servers to provide an e-commerce interface through the public cloud to remote customers of the organization, such as a user viewing the organization's e-commerce web pages on a remote user system 316.

Cloud-computing facilities are intended to provide computational bandwidth and data-storage services much as utility companies provide electrical power and water to consumers. Cloud computing provides enormous advantages to small organizations without the resources to purchase, manage, and maintain in-house data centers. Such organizations can dynamically add and delete virtual computer systems from their virtual data centers within public clouds in order to track computational-bandwidth and data-storage needs, rather than purchasing sufficient computer systems within a physical data center to handle peak computational-bandwidth and data-storage demands. Moreover, small organizations can completely avoid the overhead of maintaining and managing physical computer systems, including hiring and periodically retraining information-technology specialists and continuously paying for operating-system and database-management-system upgrades.

Furthermore, cloud-computing interfaces allow for easy and straightforward configuration of virtual computing facilities, flexibility in the types of applications and operating systems that can be configured, and other functionalities that are useful even for owners and administrators of private cloud-computing facilities used by a single organization.

Figure 4:
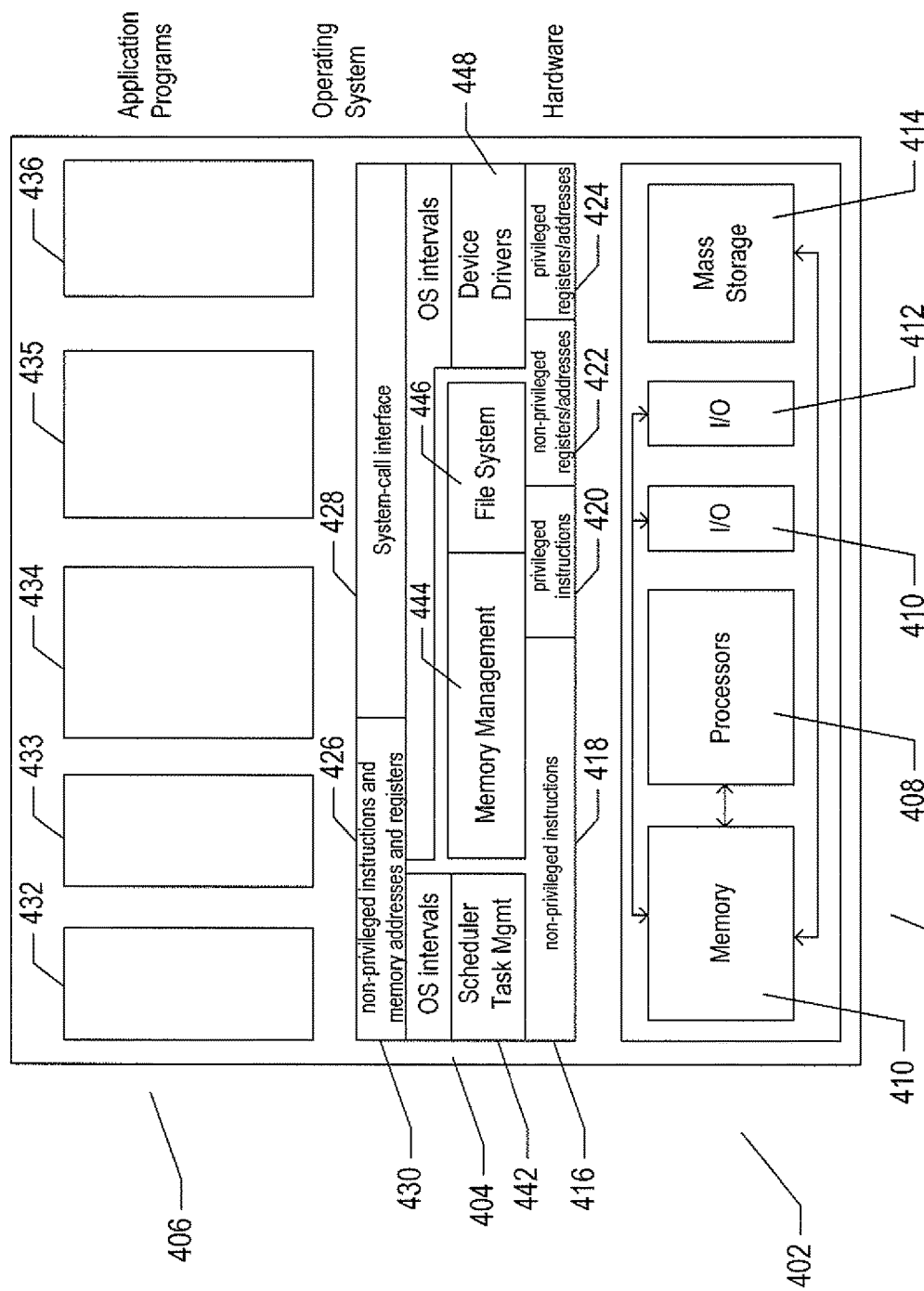
FIG. 4 illustrates generalized hardware and software components of a general-purpose computer system, such as a general-purpose computer system having an architecture similar to that shown in FIG. 1.

FIG. 4 illustrates generalized hardware and software components of a general-purpose computer system, such as a general-purpose computer system having an architecture similar to that shown in FIG. 1. The computer system 400 is often considered to include three fundamental layers: (1) a hardware layer or level 402; (2) an operating-system layer or level 404; and (3) an application-program layer or level 406. The hardware layer 402 includes one or more processors 408, system memory 410, various different types of input-output ("I/O") devices 410 and 412, and mass-storage devices 414. Of course, the hardware level also includes many other components, including power supplies, internal communications links and busses, specialized integrated circuits, many different types of processor-controlled or microprocessor-controlled peripheral devices and controllers, and many other components. The operating system 404 interfaces to the hardware level 402 through a low-level operating system and hardware interface 416 generally comprising a set of non-privileged computer instructions 418, a set of privileged computer instructions 420, a set of non-privileged registers and memory addresses 422, and a set of privileged registers and memory addresses 424. In general, the operating system exposes non-privileged instructions, non-privileged registers, and non-privileged memory addresses 426 and a system-call interface 428 as an operating-system interface 430 to application programs 432-436 that execute within an execution environment provided to the application programs by the operating system. The operating system, alone, accesses the privileged instructions, privileged registers, and privileged memory addresses. By reserving access to privileged instructions, privileged registers, and privileged memory addresses, the operating system can ensure that application programs and other higher-level computational entities cannot interfere with one another's execution and cannot change the overall state of the computer system in ways that could deleteriously impact system operation. The operating system includes many internal components and modules, including a scheduler 442, memory management 444, a file system 446, device drivers 448, and many other components and modules. To a certain degree, modern operating systems provide numerous levels of abstraction above the hardware level, including virtual memory, which provides to each application program and other computational entities a separate, large, linear memory-address space that is mapped by the operating system to various electronic memories and mass-storage devices. The scheduler orchestrates interleaved execution of various different application programs and higher-level computational entities, providing to each application program a virtual, stand-alone system devoted entirely to the application program. From the application program's standpoint, the application program executes continuously without concern for the need to share processor resources and other system resources with other application programs and higher-level computational entities. The device drivers abstract details of hardware-component operation, allowing application programs to employ the system-call interface for transmitting and receiving data to and from communications networks, mass-storage devices, and other I/O devices and subsystems. The file system 446 facilitates abstraction of mass-storage-device and memory resources as a high-level, easy-to-access, file-system interface. Thus, the development and evolution of the operating system has resulted in the generation of a type of multi-faceted virtual execution environment for application programs and other higher-level computational entities.

While the execution environments provided by operating systems have proved to be an enormously successful level of abstraction within computer systems, the operating-system-provided level of abstraction is nonetheless associated with difficulties and challenges for developers and users of application programs and other higher-level computational entities. One difficulty arises from the fact that there are many different operating systems that run within various different types of computer hardware. In many cases, popular application programs and computational systems are developed to run on only a subset of the available operating systems, and can therefore be executed within only a subset of the various different types of computer systems on which the operating systems are designed to run. Often, even when an application program or other computational system is ported to additional operating systems, the application program or other computational system can nonetheless run more efficiently on the operating systems for which the application program or other computational system was originally targeted. Another difficulty arises from the increasingly distributed nature of computer systems. Although distributed operating systems are the subject of considerable research and development efforts, many of the popular operating systems are designed primarily for execution on a single computer system. In many cases, it is difficult to move application programs, in real time, between the different computer systems of a distributed computer system for high-availability, fault-tolerance, and load-balancing purposes. The problems are even greater in heterogeneous distributed computer systems which include different types of hardware and devices running different types of operating systems. Operating systems continue to evolve, as a result of which certain older application programs and other computational entities may be incompatible with more recent versions of operating systems for which they are targeted, creating compatibility issues that are particularly difficult to manage in large distributed systems.

Figure 5A:
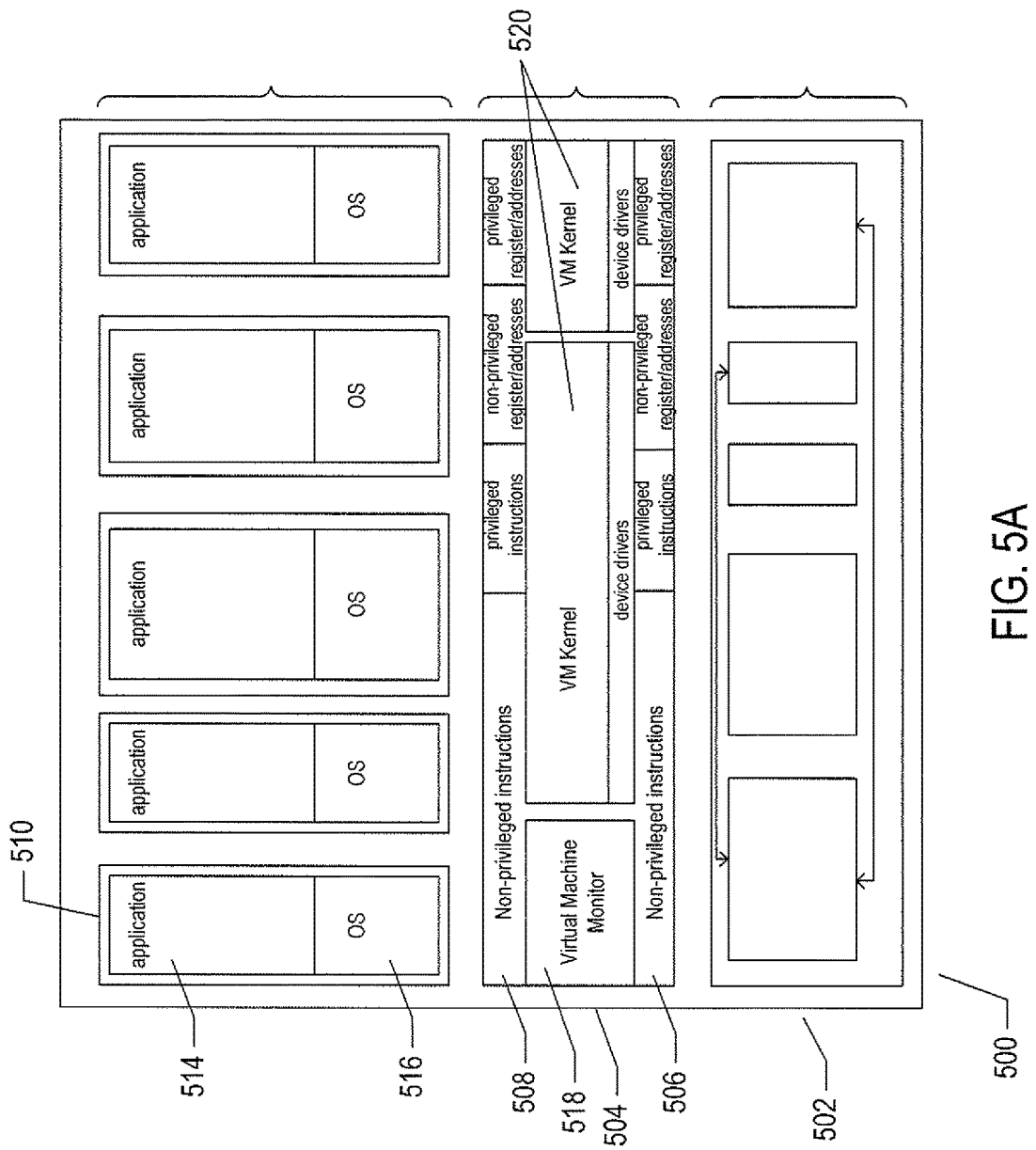
FIGS. 5A-B illustrate two types of virtual machine and virtual-machine execution environments.
Figure 5B:
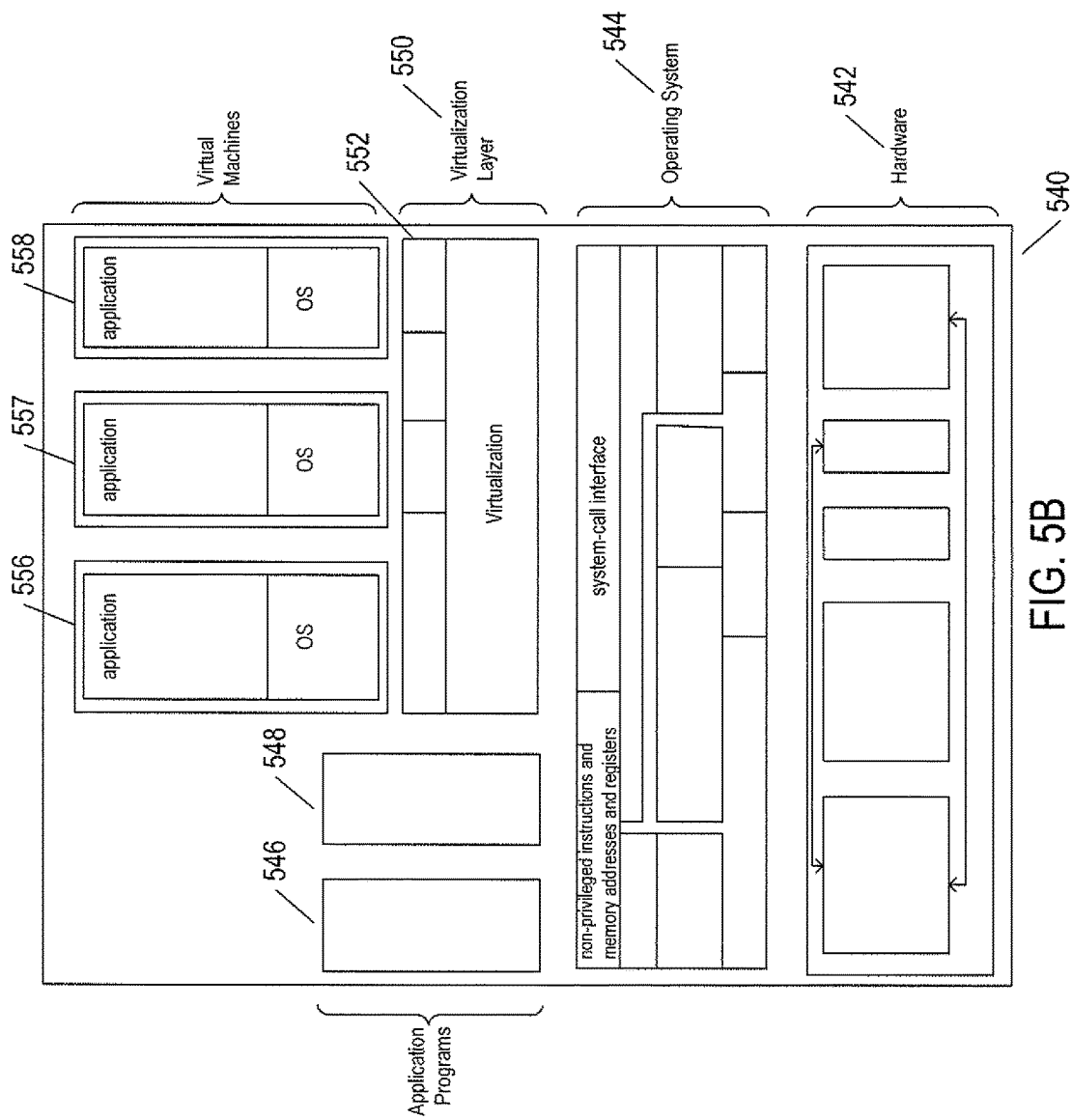

For all of these reasons, a higher level of abstraction, referred to as the "virtual machine," has been developed and evolved to further abstract computer hardware in order to address many difficulties and challenges associated with traditional computing systems, including the compatibility issues discussed above. FIGS. 5A-B illustrate two types of virtual machine and virtual-machine execution environments. FIGS. 5A-B use the same illustration conventions as used in FIG. 4. FIG. 5A shows a first type of virtualization. The computer system 500 in FIG. 5A includes the same hardware layer 502 as the hardware layer 402 shown in FIG. 4. However, rather than providing an operating system layer directly above the hardware layer, as in FIG. 4, the virtualized computing environment illustrated in FIG. 5A features a virtualization layer 504 that interfaces through a virtualization-layer/hardware-layer interface 506, equivalent to interface 416 in FIG. 4, to the hardware. The virtualization layer provides a hardware-like interface 508 to a number of virtual machines, such as virtual machine 510, executing above the virtualization layer in a virtual-machine layer 512. Each virtual machine includes one or more application programs or other higher-level computational entities packaged together with an operating system, referred to as a "guest operating system," such as application 514 and guest operating system 516 packaged together within virtual machine 510. Each virtual machine is thus equivalent to the operating-system layer 404 and application-program layer 406 in the general-purpose computer system shown in FIG. 4. Each guest operating system within a virtual machine interfaces to the virtualization-layer interface 508 rather than to the actual hardware interface 506. The virtualization layer partitions hardware resources into abstract virtual-hardware layers to which each guest operating system within a virtual machine interfaces. The guest operating systems within the virtual machines, in general, are unaware of the virtualization layer and operate as if they were directly accessing a true hardware interface. The virtualization layer ensures that each of the virtual machines currently executing within the virtual environment receive a fair allocation of underlying hardware resources and that all virtual machines receive sufficient resources to progress in execution. The virtualization-layer interface 508 may differ for different guest operating systems. For example, the virtualization layer is generally able to provide virtual hardware interfaces for a variety of different types of computer hardware. This allows, as one example, a virtual machine that includes a guest operating system designed for a particular computer architecture to run on hardware of a different architecture. The number of virtual machines need not be equal to the number of physical processors or even a multiple of the number of processors.

The virtualization layer includes a virtual-machine-monitor module 518 ("VMM") that virtualizes physical processors in the hardware layer to create virtual processors on which each of the virtual machines executes. For execution efficiency, the virtualization layer attempts to allow virtual machines to directly execute non-privileged instructions and to directly access non-privileged registers and memory. However, when the guest operating system within a virtual machine accesses virtual privileged instructions, virtual privileged registers, and virtual privileged memory through the virtualization-layer interface 508, the accesses result in execution of virtualization-layer code to simulate or emulate the privileged resources. The virtualization layer additionally includes a kernel module 520 that manages memory, communications, and data-storage machine resources on behalf of executing virtual machines ("VM kernel"). The VM kernel, for example, maintains shadow page tables on each virtual machine so that hardware-level virtual-memory facilities can be used to process memory accesses. The VM kernel additionally includes routines that implement virtual communications and data-storage devices as well as device drivers that directly control the operation of underlying hardware communications and data-storage devices. Similarly, the VM kernel virtualizes various other types of I/O devices, including keyboards, optical-disk drives, and other such devices. The virtualization layer essentially schedules execution of virtual machines much like an operating system schedules execution of application programs, so that the virtual machines each execute within a complete and fully functional virtual hardware layer.

FIG. 5B illustrates a second type of virtualization. In FIG. 5B, the computer system 540 includes the same hardware layer 542 and software layer 544 as the hardware layer 402 shown in FIG. 4. Several application programs 546 and 548 are shown running in the execution environment provided by the operating system. In addition, a virtualization layer 550 is also provided, in computer 540, but, unlike the virtualization layer 504 discussed with reference to FIG. 5A, virtualization layer 550 is layered above the operating system 544, referred to as the "host OS," and uses the operating system interface to access operating-system-provided functionality as well as the hardware. The virtualization layer 550 comprises primarily a VMM and a hardware-like interface 552, similar to hardware-like interface 508 in FIG. 5A. The virtualization-layer/hardware-layer interface 552, equivalent to interface 416 in FIG. 4, provides an execution environment for a number of virtual machines 556-558, each including one or more application programs or other higher-level computational entities packaged together with a guest operating system.

In FIGS. 5A-B, the layers are somewhat simplified for clarity of illustration. For example, portions of the virtualization layer 550 may reside within the host-operating-system kernel, such as a specialized driver incorporated into the host operating system to facilitate hardware access by the virtualization layer.

It should be noted that virtual hardware layers, virtualization layers, and guest operating systems are all physical entities that are implemented by computer instructions stored in physical data-storage devices, including electronic memories, mass-storage devices, optical disks, magnetic disks, and other such devices. The term "virtual" does not, in any way, imply that virtual hardware layers, virtualization layers, and guest operating systems are abstract or intangible. Virtual hardware layers, virtualization layers, and guest operating systems execute on physical processors of physical computer systems and control operation of the physical computer systems, including operations that alter the physical states of physical devices, including electronic memories and mass-storage devices. They are as physical and tangible as any other component of a computer since, such as power supplies, controllers, processors, busses, and data-storage devices.

Figure 6:
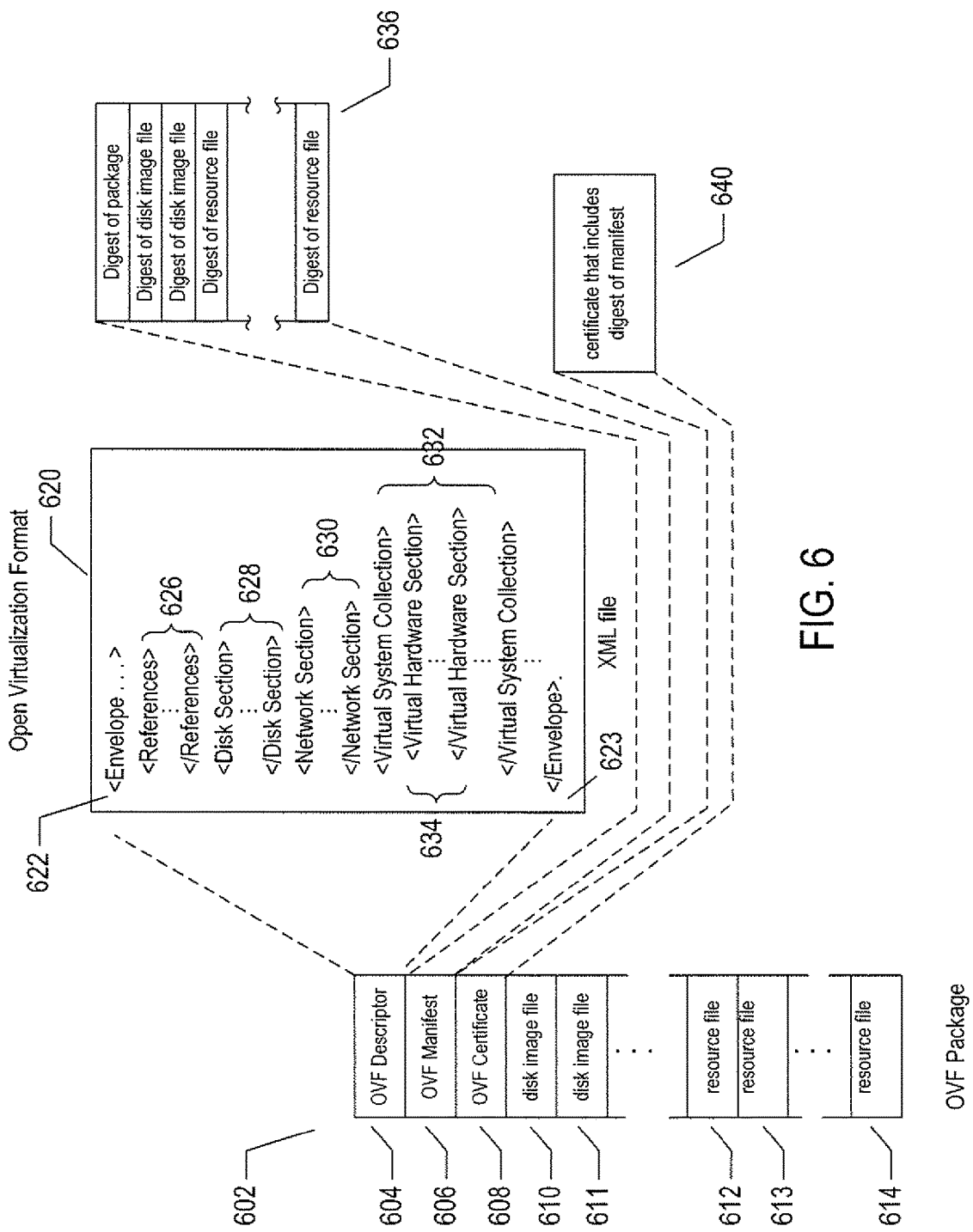
FIG. 6 illustrates an OVF package.

A virtual machine or virtual application, described below, is encapsulated within a data package for transmission, distribution, and loading into a virtual-execution environment. One public standard for virtual-machine encapsulation is referred to as the "open virtualization format" ("OVF"). The OVF standard specifies a format for digitally encoding a virtual machine within one or more data files. FIG. 6 illustrates an OVF package. An OVF package 602 includes an OVF descriptor 604, an OVF manifest 606, an OVF certificate 608, one or more disk-image files 610-611, and one or more resource files 612-614. The OVF package can be encoded and stored as a single file or as a set of files. The OVF descriptor 604 is an XML document 620 that includes a hierarchical set of elements, each demarcated by a beginning tag and an ending tag. The outermost, or highest-level, element is the envelope element, demarcated by tags 622 and 623. The next-level element includes a reference element 626 that includes references to all files that are part of the OVF package, a disk section 628 that contains meta information about all of the virtual disks included in the OVF package, a networks section 630 that includes meta information about all of the logical networks included in the OVF package, and a collection of virtual-machine configurations 632 which further includes hardware descriptions of each virtual machine 634. There are many additional hierarchical levels and elements within a typical OVF descriptor. The OVF descriptor is thus a self-describing XML file that describes the contents of an OVF package. The OVF manifest 606 is a list of cryptographic-hash-function-generated digests 636 of the entire OVF package and of the various components of the OVF package. The OVF certificate 608 is an authentication certificate 640 that includes a digest of the manifest and that is cryptographically signed. Disk image files, such as disk image file 610, are digital encodings of the contents of virtual disks and resource files 612 are digitally encoded content, such as operating-system images. A virtual machine or a collection of virtual machines encapsulated together within a virtual application can thus be digitally encoded as one or more files within an OVF package that can be transmitted, distributed, and loaded using well-known tools for transmitting, distributing, and loading files. A virtual appliance is a software service that is delivered as a complete software stack installed within one or more virtual machines that is encoded within an OVF package.

Figure 7:
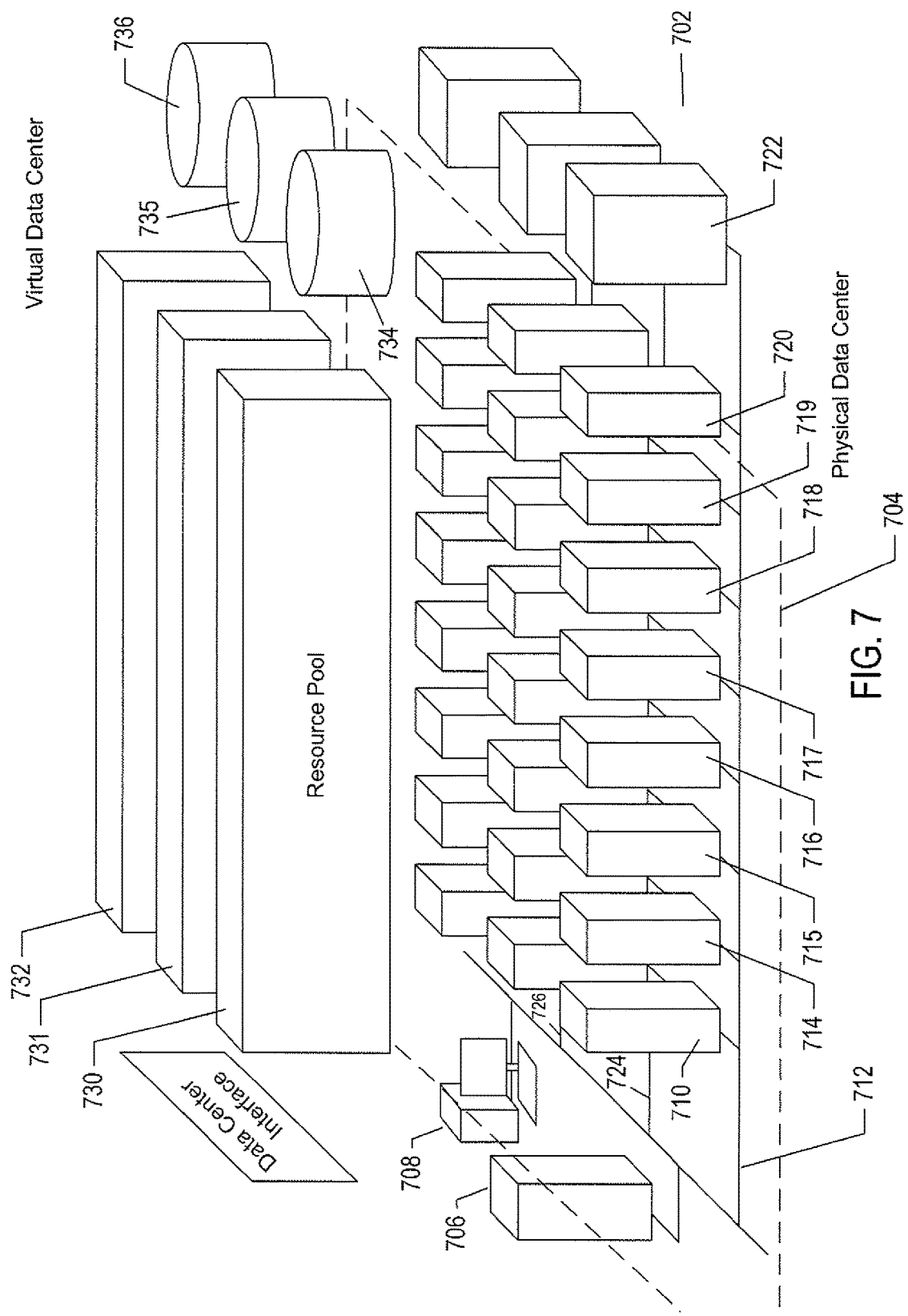
FIG. 7 illustrates virtual data centers provided as an abstraction of underlying physical-data-center hardware components.

The advent of virtual machines and virtual environments has alleviated many of the difficulties and challenges associated with traditional general-purpose computing. Machine and operating-system dependencies can be significantly reduced or entirely eliminated by packaging applications and operating systems together as virtual machines and virtual appliances that execute within virtual environments provided by virtualization layers running on many different types of computer hardware. A next level of abstraction, referred to as virtual data centers which are one example of a broader virtual-infrastructure category, provide a data-center interface to virtual data centers computationally constructed within physical data centers. FIG. 7 illustrates virtual data centers provided as an abstraction of underlying physical-data-center hardware components. In FIG. 7, a physical data center 702 is shown below a virtual-interface plane 704. The physical data center consists of a virtual-infrastructure management server ("VI-management-server") 706 and any of various different computers, such as PCs 708, on which a virtual-data-center management interface may be displayed to system administrators and other users. The physical data center additionally includes generally large numbers of server computers, such as server computer 710, that are coupled together by local area networks, such as local area network 712 that directly interconnects server computer 710 and 714-720 and a mass-storage array 722. The physical data center shown in FIG. 7 includes three local area networks 712, 724, and 726 that each directly interconnects a bank of eight servers and a mass-storage array. The individual server computers, such as server computer 710, each includes a virtualization layer and runs multiple virtual machines. Different physical data centers may include many different types of computers, networks, data-storage systems and devices connected according to many different types of connection topologies. The virtual-data-center abstraction layer 704, a logical abstraction layer shown by a plane in FIG. 7, abstracts the physical data center to a virtual data center comprising one or more resource pools, such as resource pools 730-732, one or more virtual data stores, such as virtual data stores 734-736, and one or more virtual networks. In certain implementations, the resource pools abstract banks of physical servers directly interconnected by a local area network.

The virtual-data-center management interface allows provisioning and launching of virtual machines with respect to resource pools, virtual data stores, and virtual networks, so that virtual-data-center administrators need not be concerned with the identities of physical-data-center components used to execute particular virtual machines. Furthermore, the VI-management-server includes functionality to migrate running virtual machines from one physical server to another in order to optimally or near optimally manage resource allocation, provide fault tolerance, and high availability by migrating virtual machines to most effectively utilize underlying physical hardware resources, to replace virtual machines disabled by physical hardware problems and failures, and to ensure that multiple virtual machines supporting a high-availability virtual appliance are executing on multiple physical computer systems so that the services provided by the virtual appliance are continuously accessible, even when one of the multiple virtual appliances becomes compute bound, data-access bound, suspends execution, or fails. Thus, the virtual data center layer of abstraction provides a virtual-data-center abstraction of physical data centers to simplify provisioning, launching, and maintenance of virtual machines and virtual appliances as well as to provide high-level, distributed functionalities that involve pooling the resources of individual physical servers and migrating virtual machines among physical servers to achieve load balancing, fault tolerance, and high availability.

Figure 8:
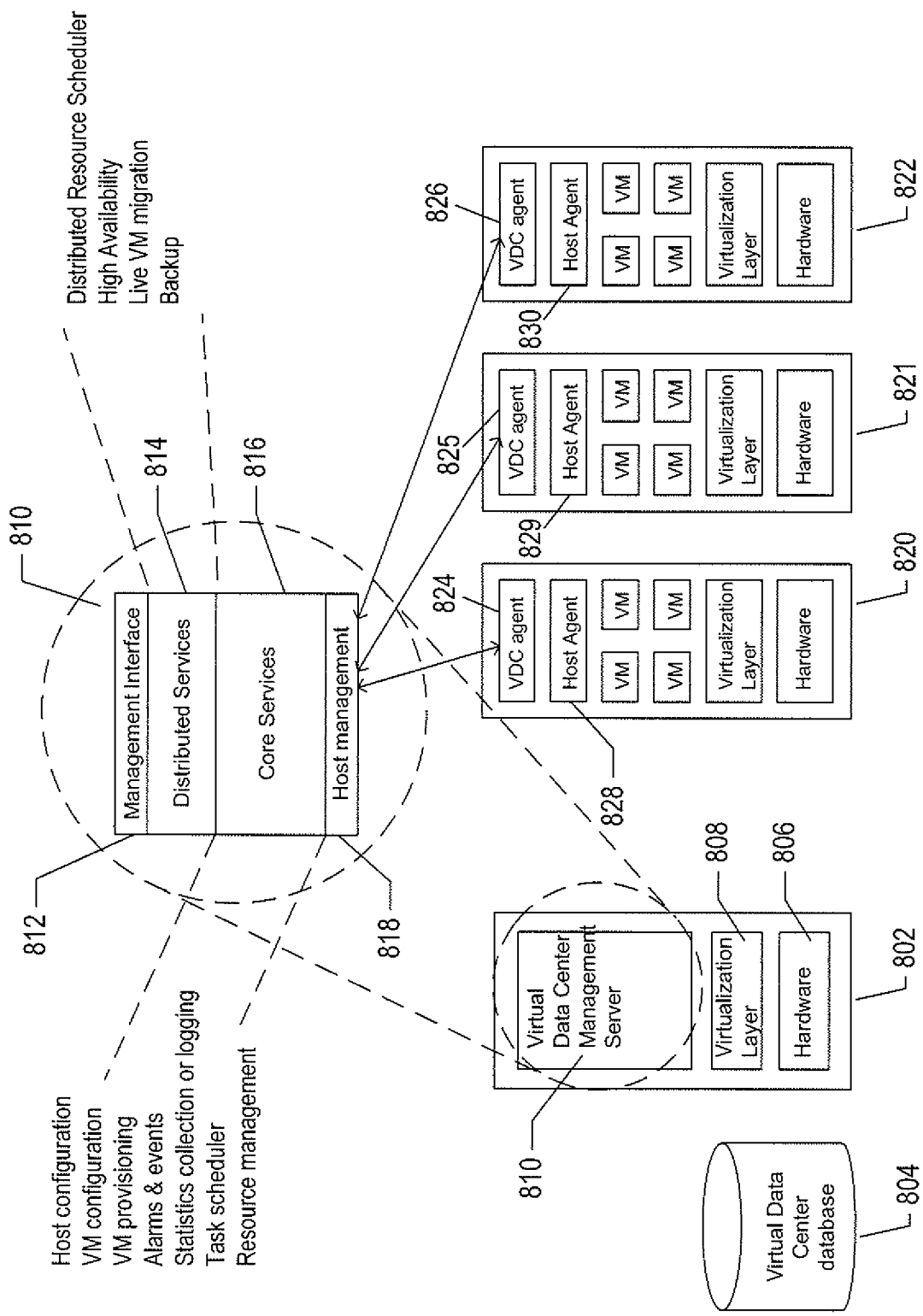
FIG. 8 illustrates virtual-machine components of a VI-management-server and physical servers of a physical data center above which a virtual-data-center interface is provided by the VI-management-server.

FIG. 8 illustrates virtual-machine components of a VI-management-server and physical servers of a physical data center above which a virtual-data-center interface is provided by the VI-management-server. The VI-management-server 802 and a virtual-data-center database 804 comprise the physical components of the management component of the virtual data center. The VI-management-server 802 includes a hardware layer 806 and virtualization layer 808, and runs a virtual-data-center management-server virtual machine 810 above the virtualization layer. Although shown as a single server in FIG. 8, the VI-management-server ("VI management server") may include two or more physical server computers that support multiple VI-management-server virtual appliances. The virtual machine 810 includes a management-interface component 812, distributed services 814, core services 816, and a host-management interface 818. The management interface is accessed from any of various computers, such as the PC 708 shown in FIG. 7. The management interface allows the virtual-data-center administrator to configure a virtual data center, provision virtual machines, collect statistics and view log files for the virtual data center, and to carry out other, similar management tasks. The host-management interface 818 interfaces to virtual-data-center agents 824, 825, and 826 that execute as virtual machines within each of the physical servers of the physical data center that is abstracted to a virtual data center by the VI management server.

The distributed services 814 include a distributed-resource scheduler that assigns virtual machines to execute within particular physical servers and that migrates virtual machines in order to most effectively make use of computational bandwidths, data-storage capacities, and network capacities of the physical data center. The distributed services further include a high-availability service that replicates and migrates virtual machines in order to ensure that virtual machines continue to execute despite problems and failures experienced by physical hardware components. The distributed services also include a live-virtual-machine migration service that temporarily halts execution of a virtual machine, encapsulates the virtual machine in an OVF package, transmits the OVF package to a different physical server, and restarts the virtual machine on the different physical server from a virtual-machine state recorded when execution of the virtual machine was halted. The distributed services also include a distributed backup service that provides centralized virtual-machine backup and restore.

The core services provided by the VI management server include host configuration, virtual-machine configuration, virtual-machine provisioning, generation of virtual-data-center alarms and events, ongoing event logging and statistics collection, a task scheduler, and a resource-management module. Each physical server 820-822 also includes a host-agent virtual machine 828-830 through which the virtualization layer can be accessed via a virtual-infrastructure application programming interface ("API"). This interface allows a remote administrator or user to manage an individual server through the infrastructure API. The virtual-data-center agents 824-826 access virtualization-layer server information through the host agents. The virtual-data-center agents are primarily responsible for offloading certain of the virtual-data-center management-server functions specific to a particular physical server to that physical server. The virtual-data-center agents relay and enforce resource allocations made by the VI management server, relay virtual-machine provisioning and configuration-change commands to host agents, monitor and collect performance statistics, alarms, and events communicated to the virtual-data-center agents by the local host agents through the interface API, and to carry out other, similar virtual-data-management tasks.

The virtual-data-center abstraction provides a convenient and efficient level of abstraction for exposing the computational resources of a cloud-computing facility to cloud-computing-infrastructure users. A cloud-director management server exposes virtual resources of a cloud-computing facility to cloud-computing-infrastructure users. In addition, the cloud director introduces a multi-tenancy layer of abstraction, which partitions virtual data centers ("VDCs") into tenant-associated VDCs that can each be allocated to a particular individual tenant or tenant organization, both referred to as a "tenant." A given tenant can be provided one or more tenant-associated VDCs by a cloud director managing the multi-tenancy layer of abstraction within a cloud-computing facility. The cloud services interface (308 in FIG. 3) exposes a virtual-data-center management interface that abstracts the physical data center.

Figure 9:
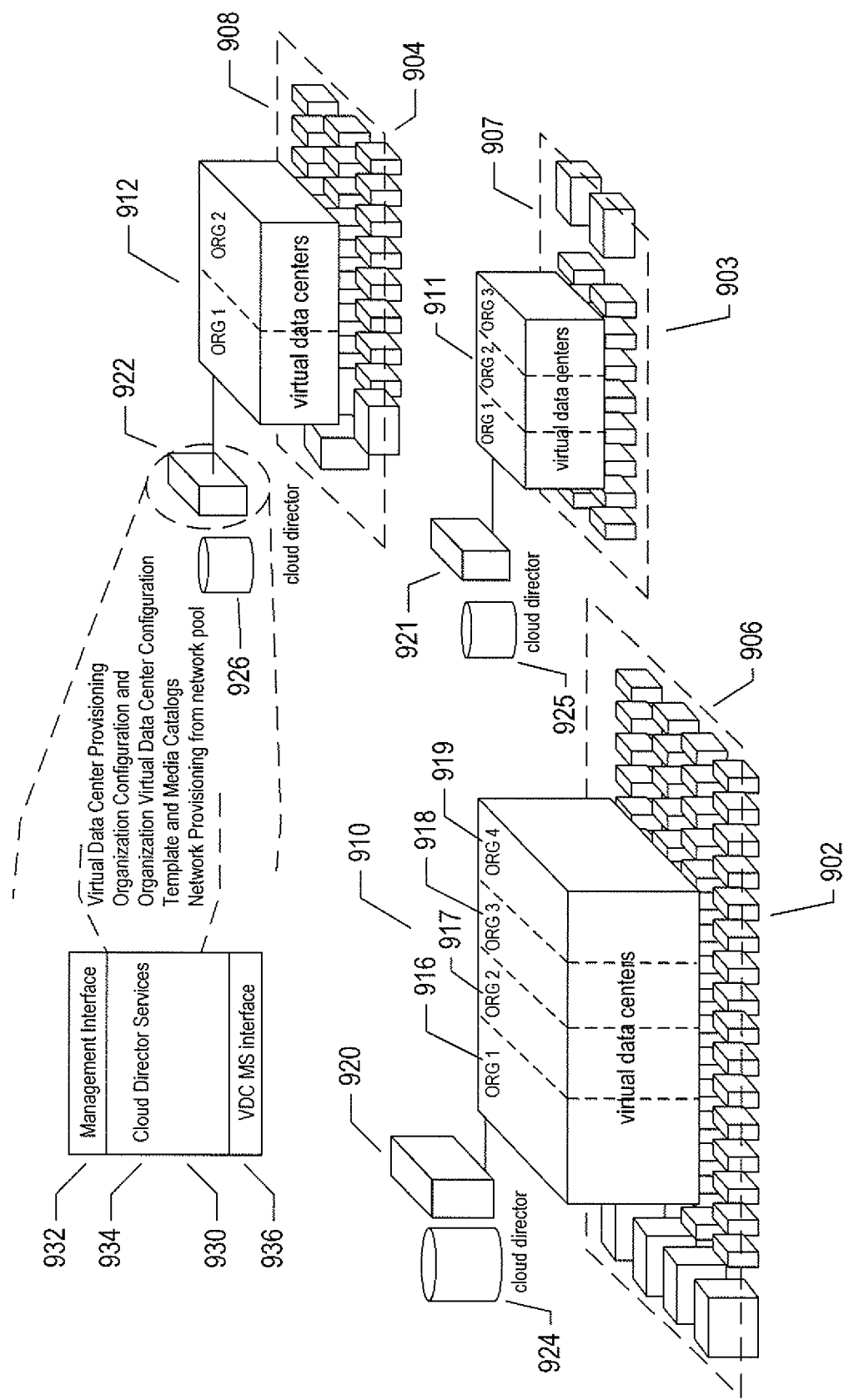
FIG. 9 illustrates a cloud-director level of abstraction.

FIG. 9 illustrates a cloud-director level of abstraction. In FIG. 9, three different physical data centers 902-904 are shown below planes representing the cloud-director layer of abstraction 906-908. Above the planes representing the cloud-director level of abstraction, multi-tenant virtual data centers 910-912 are shown. The resources of these multi-tenant virtual data centers are securely partitioned in order to provide secure virtual data centers to multiple tenants, or cloud-services-accessing organizations. For example, a cloud-services-provider virtual data center 910 is partitioned into four different tenant-associated virtual-data centers within a multi-tenant virtual data center for four different tenants 916-919. Each multi-tenant virtual data center is managed by a cloud director comprising one or more cloud-director servers 920-922 and associated cloud-director databases 924-926. Each cloud-director server or servers runs a cloud-director virtual appliance 930 that includes a cloud-director management interface 932, a set of cloud-director services 934, and a virtual-data-center management-server interface 936. The cloud-director services include an interface and tools for provisioning multi-tenant virtual data center virtual data centers on behalf of tenants, tools and interfaces for configuring and managing tenant organizations, tools and services for organization of virtual data centers and tenant-associated virtual data centers within the multi-tenant virtual data center, services associated with template and media catalogs, and provisioning of virtualization networks from a network pool. Templates are virtual machines that each contains an OS and/or one or more virtual machines containing applications. A template may include much of the detailed contents of virtual machines and virtual appliances that are encoded within OVF packages, so that the task of configuring a virtual machine or virtual appliance is significantly simplified, requiring only deployment of one OVF package. These templates are stored in catalogs within a tenant's virtual-data center. These catalogs are used for developing and staging new virtual appliances and published catalogs are used for sharing templates in virtual appliances across organizations. Catalogs may include OS images and other information relevant to construction, distribution, and provisioning of virtual appliances.

Considering FIGS. 7 and 9, the VI management server and cloud-director layers of abstraction can be seen, as discussed above, to facilitate employment of the virtual-data-center concept within private and public clouds. However, this level of abstraction does not fully facilitate aggregation of single-tenant and multi-tenant virtual data centers into heterogeneous or homogeneous aggregations of cloud-computing facilities.

Figure 10:
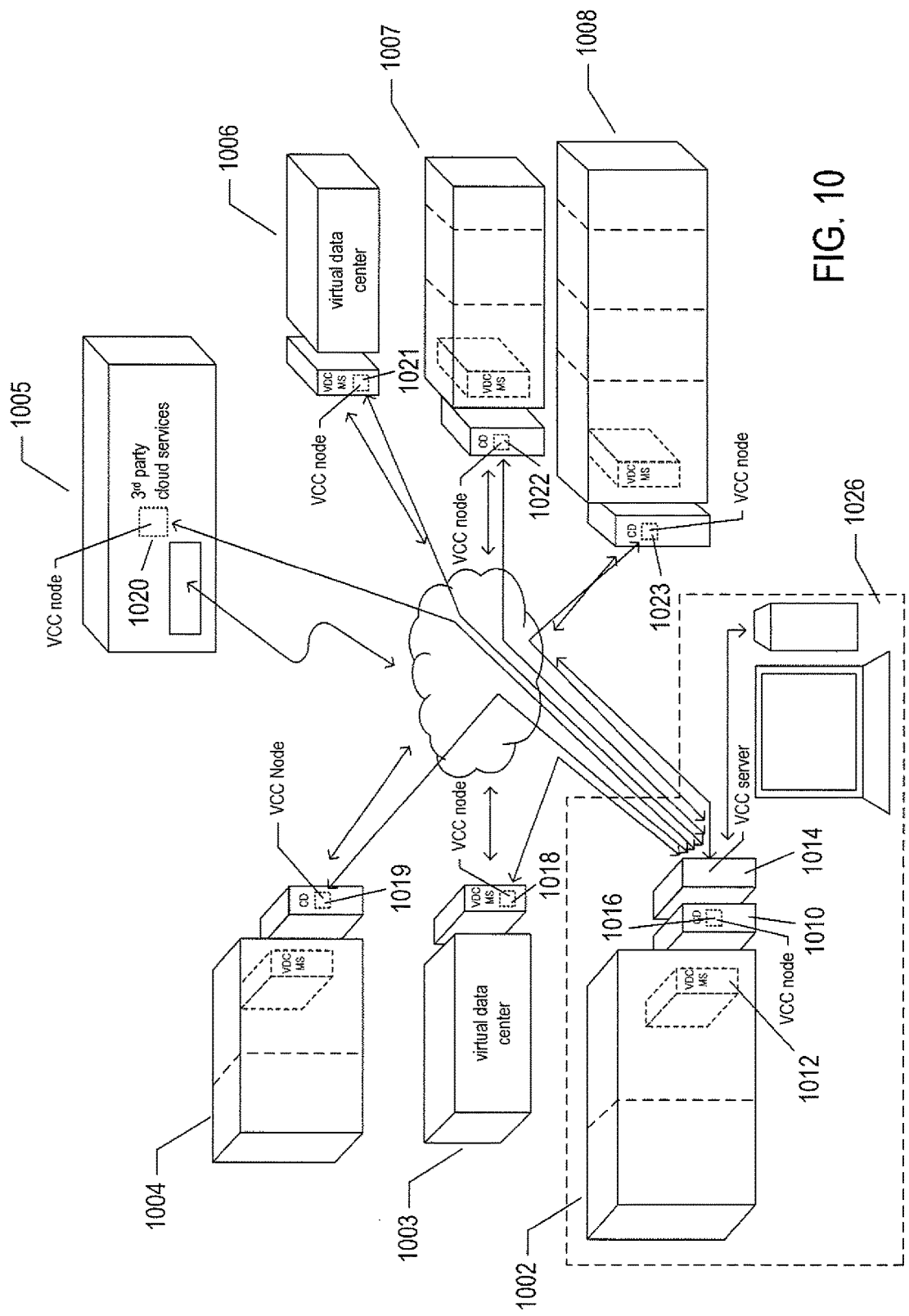
FIG. 10 illustrates virtual-cloud-connector nodes ("VCC nodes") and a VCC server, components of a distributed system that provides multi-cloud aggregation and that includes a cloud-connector server and cloud-connector nodes that cooperate to provide services that are distributed across multiple clouds.

FIG. 10 illustrates virtual-cloud-connector nodes ("VCC nodes") and a VCC server, components of a distributed system that provides multi-cloud aggregation and that includes a cloud-connector server and cloud-connector nodes that cooperate to provide services that are distributed across multiple clouds. VMware vCloud™ VCC servers and nodes are one example of VCC server and nodes. In FIG. 10, seven different cloud-computing facilities are illustrated 1002-1008. Cloud-computing facility 1002 is a private multi-tenant cloud with a cloud director 1010 that interfaces to a VI management server 1012 to provide a multi-tenant private cloud comprising multiple tenant-associated virtual data centers. The remaining cloud-computing facilities 1003-1008 may be either public or private cloud-computing facilities and may be single-tenant virtual data centers, such as virtual data centers 1003 and 1006, multi-tenant virtual data centers, such as multi-tenant virtual data centers 1004 and 1007-1008, or any of various different kinds of third-party cloud-services facilities, such as third-party cloud-services facility 1005. An additional component, the VCC server 1014, acting as a controller is included in the private cloud-computing facility 1002 and interfaces to a VCC node 1016 that runs as a virtual appliance within the cloud director 1010. A VCC server may also run as a virtual appliance within a VI management server that manages a single-tenant private cloud. The VCC server 1014 additionally interfaces, through the Internet, to VCC node virtual appliances executing within remote VI management servers, remote cloud directors, or within the third-party cloud services 1018-1023. The VCC server provides a VCC server interface that can be displayed on a local or remote terminal, PC, or other computer system 1026 to allow a cloud-aggregation administrator or other user to access VCC-server-provided aggregate-cloud distributed services. In general, the cloud-computing facilities that together form a multiple-cloud-computing aggregation through distributed services provided by the VCC server and VCC nodes are geographically and operationally distinct.

Method and Subsystems for Compressing Metric Data

Figure 11:
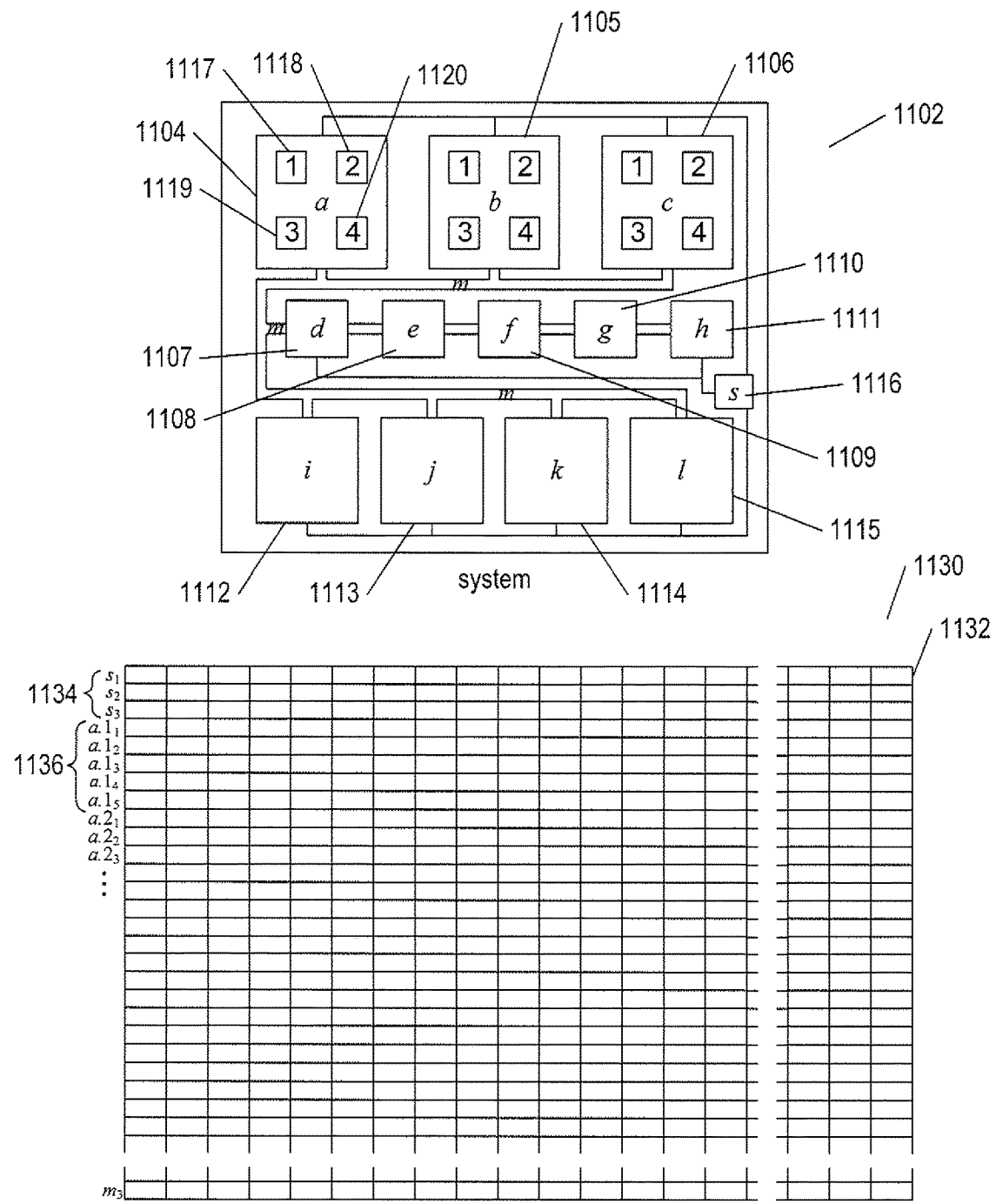
FIG. 11 illustrate metric data that is collected, processed, and used by the administrative and management subsystems within a computer system.

FIG. 11 illustrate metric data that is collected, processed, and used by the administrative and management subsystems within a computer system. At the top of FIG. 11, an abstract system block diagram 1102 is shown. This system includes 11 main subcomponents a-m and s 1104-1116 and four subcomponents in each of components a, b, and c, such as subcomponents 1117-1120 in component a 1104. The system is abstractly characterized and no further details with regard to component functionalities, interfaces, and connections are provided.

In a complex system, various types of information are collected with regard to the operational states and statuses of many, if not all, components, subcomponents, systems, and subsystems. The information can be encoded in many different ways, can be expressed in many different forms, and can be provided by a number of different information sources. For example, metrics may be provided by various types of monitoring applications and monitoring hardware within a computer system. As another example, metrics may be obtained from log files that store various types of log messages and error messages generated by computer-system components. However, for the purposes of the current discussion, this information can be described as a set of time-stamped or time-associated floating-point numbers. Clearly, even for descriptive textural information, there is generally a finite number of different values or forms of the information, as a result of which any such information can be mapped to numeric values. Thus, no generality is lost by considering the information from various types of monitoring and diagnostic agents and subsystems within the system to be floating-point values, also referred to as "metric values" and "metric data." Information may be generated, within the system, with regard to each of the systems, subsystems, components, and subcomponents within a computational system. Thus, the operational state and status of each component, subcomponent, system, and subsystem is described, at any given point in time, by the current values for all attributes reported for the component, subcomponent, system, or subsystem. Table 1130, in the lower portion of FIG. 11, illustrates a portion of the metric data collected for the system shown in block diagram 1102. Each row in the table, such as the first row 1132, represents a time series of metric-data values. The first three rows 1134 of the table represent the data of three different metrics, $s_1$, $s_2$, and $s_3$ for subcomponent s 1116. The next five rows 1136 of table 1130 represent the data stored for five metrics associated with subcomponent 1 (1117 in FIG. 11) of subcomponent a 1104. Additional rows of the table represent data for additional metrics collected for the other components of the abstract computer system represented by block diagram 1102. In an actual computer system, there may be tens or hundreds of different metrics associated with any particular main subcomponent of a distributed computing system, and there may be thousands, tens of thousands, or more subcomponents.

Figure 12A:
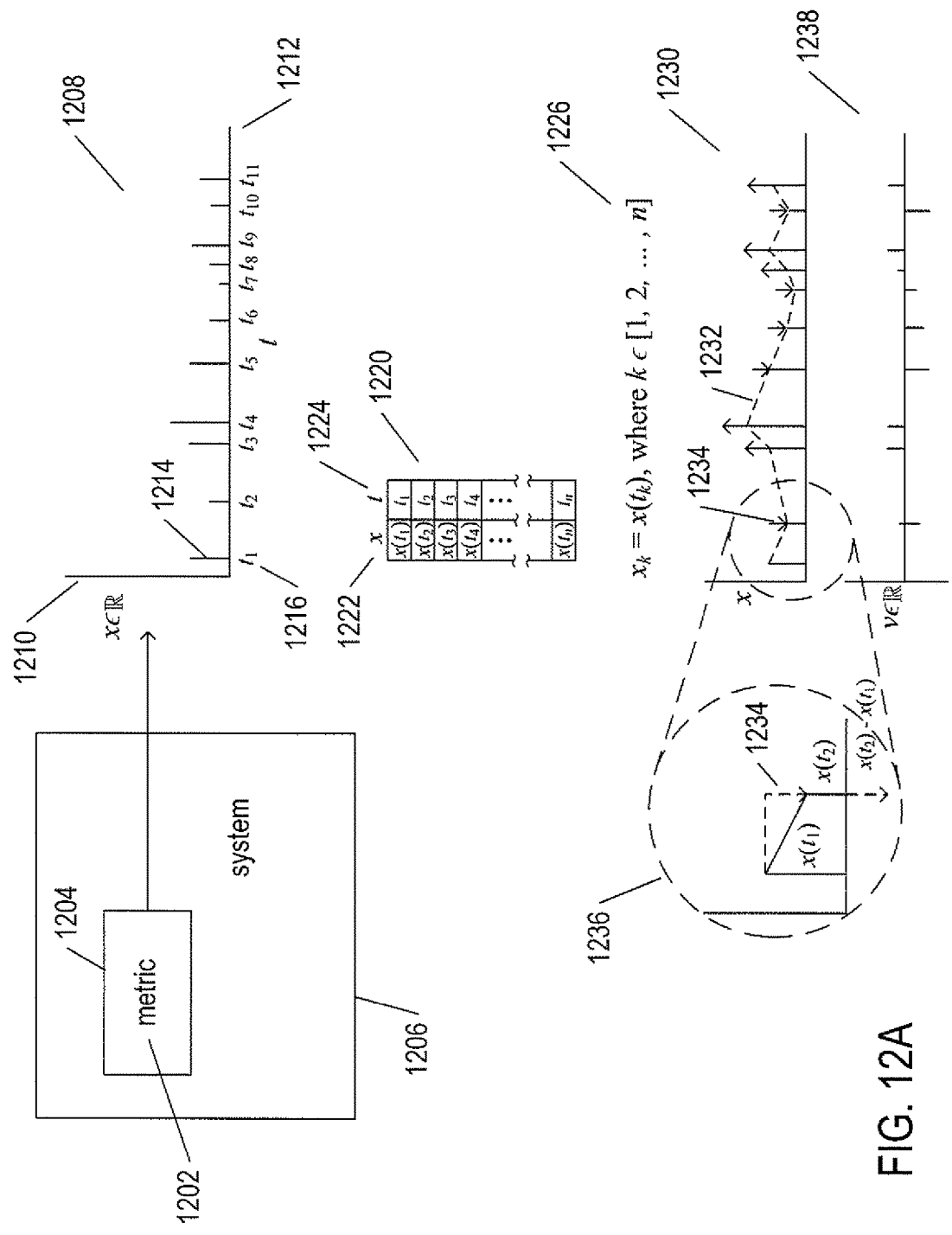
FIGS. 12A-B illustrate metric data, metric-data variation, and various types of metric-data compression.
Figure 12B:
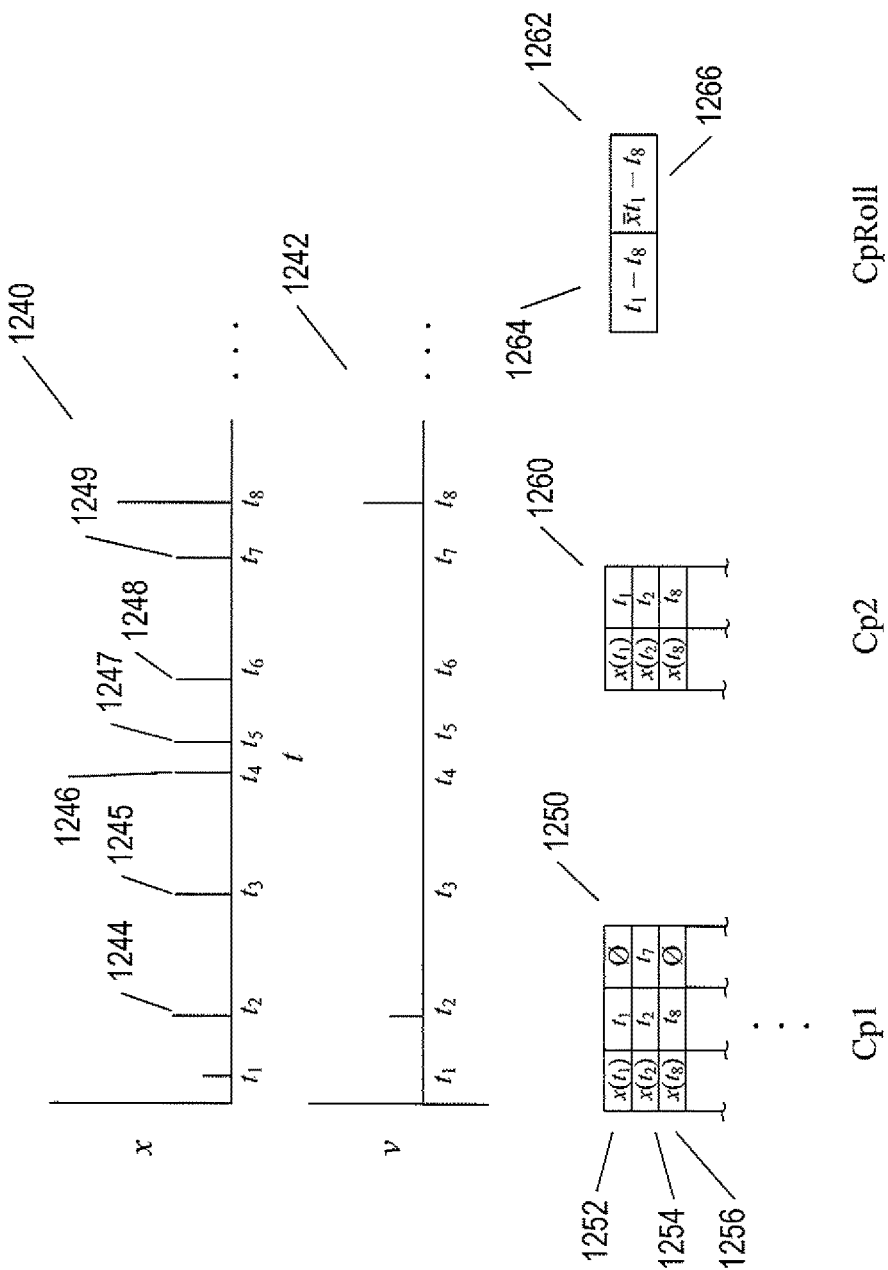

FIGS. 12A-B illustrate metric data, metric-data variation, and various types of metric-data compression. In FIG. 12A, a metric 1202 is shown to be associated with a component 1204 of a system 1206. The metric generates a time-associated sequence of numeric values, a portion of which is shown in plot 1208. The vertical axis represents floating-point values 1210 and the horizontal axis represents time 1212. Each datapoint is shown in the plot as a vertical bar, such as vertical bar 1214 associated with time $t_1$ 1216, the length of the vertical bar representing a floating-point value. In many cases, a metric outputs data values associated with timestamps over an extended period of time. Often, the data values associated with particular time intervals are compressed and stored in long-term storage. For example, the raw data values may be temporarily stored without compression, and blocks, chunks, or other such portions of these data values may be periodically compressed and stored in long-term storage while newly generated data values continue to accumulate in raw form. The data values for a metric may be alternatively represented by a table 1220 that includes a first column 1222 that stores numeric values and a second column 1224 that stores the associated times or timestamps. As shown in expression 1226 in FIG. 12A, the metric may be represented as a series of numeric values $x_k$, each numeric value $x_k$ generated by a function $x(t_k)$, where $t_k$ is the time associated with the $k^{th}$ numeric value $x_k$. There are n numeric values in the metric data $x_k$.

In the lower portion of FIG. 12A, the plot of the metric data 1208 is shown again as plot 1230 with a dashed line 1232 added to represent a numeric-value-versus-time curve corresponding to the discrete numeric-value/time pairs plotted in the plot. In addition, small arrows, such as arrow 1234, are included to show the current trend, or slope, of the curve from the preceding data point to the current data point at each of the second through $11^{th}$ data points. As shown in inset 1236, the small arrow 1234 is the signed difference between the numeric value of a current data point and the numeric value of the previous data point. These signed differences can be plotted in a second plot 1238 for the function $v(t_k)$ which generates the signed trend or slope at each of the timepoints $t_k$, where $k \in [2, 3, \ldots, n]$.

FIG. 12B shows numerous different compression techniques that can be used to compress metric data depending on the variability of the data, as indicated by the signed values produced by the function $v(t_k)$, discussed above with reference to plot 1238. In FIG. 12B, a metric-data plot 1240 and corresponding data-variation plot 1242 are shown using the same illustration conventions as used in FIG. 12A. In this case, the data values of data point 1244-1249 are identical, as a result of which the variation values in the variation plot 1242 are 0 for timepoints $t_3, t_4, \ldots, t_7$. When, in other words, $v_k=0$, there has been no change in the metric data values between timepoints $t_{k-1}$ and $t_k$. The timepoints for which $v_k=0$ are thus candidates for compression. In one scheme, referred to below as "Cp1," each data value is associated with one or two timestamps 1250. A datapoint associated with one timestamp, such as datapoint $x(t_1)$ 1252, indicates a numeric value different from the adjacent numeric values in the time sequence of datapoints. A data value associated with two timestamps, such as data value $x(t_2)$ 1254, indicates that at the two timestamps and any intervening timestamps, the value of the metric at a constant value is equal to the numeric value. Thus, the three entries 1252, 1254, and 1256 in table 1250, representing an example of the compression technique Cp1, fully describe the eight numeric values shown in plot 1240 associated with times $t_1$-$t_8$. For constant or near-constant metrics, Cp1 compression provides large compression ratios, where the compression ratio is the number of bytes of raw data divided by the number of bytes of corresponding compressed data. A second type of compression, referred to below as "Cp2," is illustrated in table 1260 in FIG. 12B. In this technique, each numeric value in the table is associated with a single timestamp. However, all numeric-value/timestamp pairs for points in time $t_k$ for which $v(t_k)=0$ are omitted. This technique also achieves large compression ratios for constant and low-variability metric data. A third compression technique, referred to below as "CpRoll," summarizes a sequence of metric data values as the average data value for the time interval corresponding to a sequence of data values, and thus a single entry 1262 is used to represent a potentially very long sequence of data values. A first portion of the entry 1264 indicates the time interval represented by the entry and a second portion 1266 of the entry includes the average numeric value for the sequence of numeric values of the time interval 1264. The Cp1 and Cp2 compression methods are lossless. The exact, original metric data can be restored from the compressed data. The CpRoll compression technique provides an extremely high compression ratio for constant, low-variability, and high-variability data, but is, unlike the lossless compression methods Cp1 and Cp2, lossy. Only a single average value can be obtained from the compressed data for an entire time interval, without any indication of the variability in the data within the time period.

There are many additional types of compression, including run-length encoding, Huffman encoding, computing differences or deltas, linear-algebra based encoding methods, and many complex types of compression employed for particular classes of data, including MPEG, JPEG, and H.264 encoding methods. Many of these methods do not work well for metric data. Others may be used in addition to, or in place of, the above discussed Cp1, Cp2, and CpRoll methods. In the following discussion, the meaning of the term "Cp1" is expanded to refer to the general class of compression methods suitable and efficient for constant and near-constant metric data, the term "Cp2" is expanded to refer to the general class of compression methods suitable and efficient for low-variability metric data, and the term "CpRoll is expanded to refer to the general class of compression methods that are suitable for constant, near-constant, low-variability, and high-variability metric data, that are significantly lossy in nature, and that are based on statistically derived metrics, such as average or median values.

FIG. 13 illustrates linear combination of two different metrics. FIG. 13 uses the same metric-data-plot convention as used in FIGS. 12A-B. In FIG. 13, a first plot 1302 shows the metric data for a metric $X_1$ and a second plot 1304 shows the data values for metric $X_2$. Metric $X_1$ features data values that linearly increase with time and metric $X_2$ includes data values that linearly decrease in time. Plot 1306 is generated by adding each data value of metric $X_1$ to the corresponding data value of metric $X_2$. For example, the first numeric value for metric $X_1$ 1308 is 1.0 and the first data value for metric $X_2$ 1310 is 11.0. The sum of these two data values is 12.0, which is the value of the first data value 1312 in plot 1306. Plot 1306 is described as a metric generated by a linear combination of metric $X_1$ and $X_2$. For this example, the linear combination is expressed as $X_1+X_2$. A linear combination can include multiplicative coefficients for each term. For example, plot 1314 is a composite metric generated by the linear combination $\frac{1}{2}X_1+\frac{1}{2}X_2$. A composite metric value can be generated from an arbitrary number of metrics, each multiplied by a constant: $X_{composite}=a_1X_1+a_2X_2+\ldots+a_nX_n$.

Figure 14:
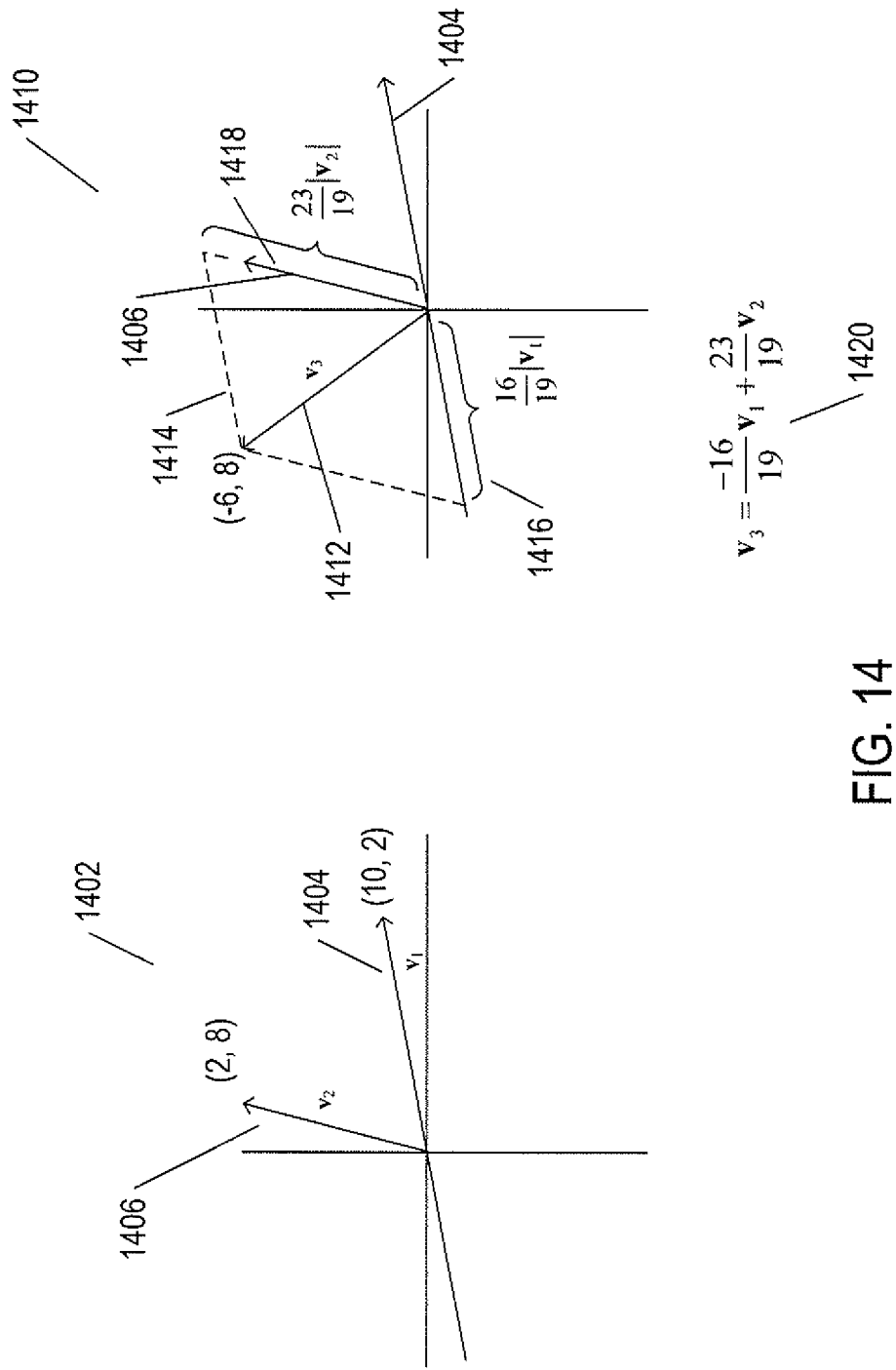
FIG. 14 illustrates the notion of a set of basis vectors.

FIG. 14 illustrates the notion of a set of basis vectors. FIG. 14 uses a two-dimensional vector space to illustrate the concept of a vector basis. In a let-hand plot 1402 in FIG. 14, two arbitrary vectors $v_1$ 1404 and $v_2$ 1406 are shown. Vector $v_1$ can alternatively be described by the coordinates of its head (10, 2) and, similarly, vector $v_2$ can be described by the coordinates (2, 8). Provided that the two arbitrary vectors $v_1$ and $v_2$ are not parallel, any other vector in the two-dimensional vector space can be expressed as a linear combination of vectors $v_1$ and $v_2$. In the right-hand plot 1410 in FIG. 14, a third arbitrary vector $v_3$ 1412 is plotted in addition to vectors $v_1$ 1404 and $v_2$ 1406. The dashed lines, such as dashed line 1414, indicate a geometrical construction for a pair of vectors that, when added, produce vector $v_3$. The first vector 1416 in the pair of vectors is collinear with vector $v_1$ and has a length equal to $\frac{16}{19}|v_1|$. The second vector 1418 of the pair of vectors is collinear with vector $v_2$ and has a length equal to $$\frac{23}{19}|v_2|.$$

Thus, vector $v_3$ can De expressed as the linear combination of vectors $v_1$ and $v_2$, as follows:

$$v_3 = \frac{-16}{19}v_1 + \frac{23}{19}v_2.$$

In a three-dimensional space, an arbitrary vector can be expressed as a linear combination of three arbitrary vectors, no two of which are parallel. In an n-dimensional vector space, an arbitrary vector can be expressed as the linear combination of n different, arbitrary vectors, no pair of which are parallel.

Figure 15:
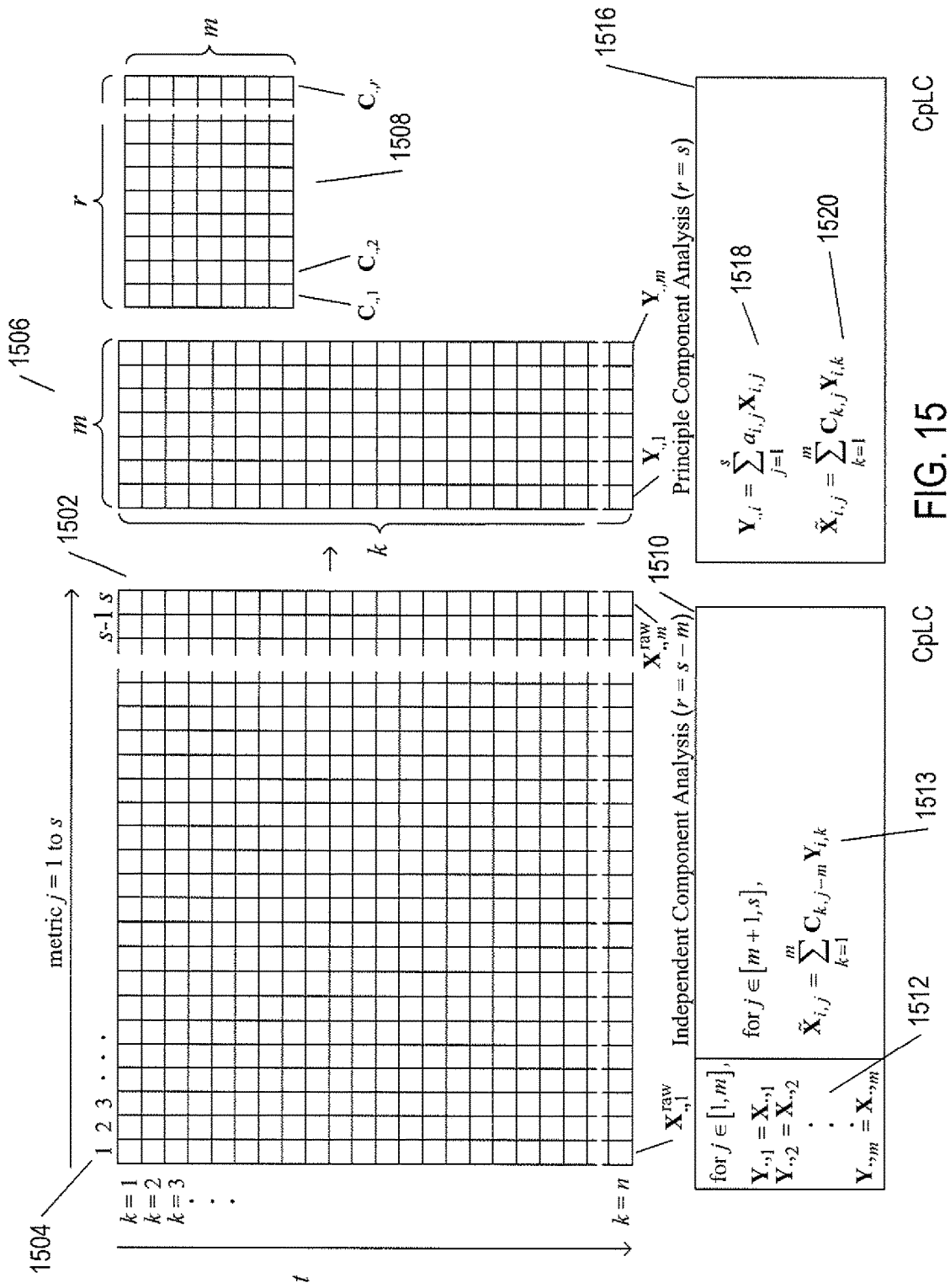
FIG. 15 illustrates a general approach for compressing high-variability metric data using the concept of a set of basis vectors and a set of coefficients for linear combinations.

FIG. 15 illustrates a general approach for compressing high-variability metric data using the concept of a set of basis vectors and a set of coefficients for linear combinations. As shown in the top left-hand portion of FIG. 15, the high-variability metric data can be considered to be a matrix $X^{raw}$ 1502. Each column in matrix $X^{raw}$, such as the first column 1504, denoted $X_1^{raw}$, represents the data associated with a metric. Each row in matrix $X^{raw}$ represents a point in time. There are n rows and s columns. The compression method identifies a set of basis metrics 1506. Each column of matrix Y 1506 represents one of the basis metrics. Every non-basis metric in $X^{raw}$ can be computed as a linear combination of the basis metrics 1506. The coefficients for these linear combinations are stored in a coefficient matrix C 1508. Thus, a large set of metric data $X^{raw}$ can be compressed to a comparatively small set of basis metrics 1506 and a set of coefficients 1508. Note that this compression method assumes that all of the metric data, represented by columns in $X^{raw}$, are aligned with respect to timepoints, represented by row indices k of the matrix $X^{raw}$. When the set of metrics are not so aligned in time, interpolation and other methods can be used to produce an aligned set of metric data. Additionally, the total metric data for a time interval within a computing system can be partitioned into similarity groups, where similar metrics are roughly time-aligned and the compression method illustrated in FIG. 15 can be used to separately compress each similarity group, minimizing the amount of interpolation and other adjustments needed to produce a time-aligned set of raw data.

In the following discussion, two different approaches to expressing a set of metrics in terms of a small set of independent, basis metrics and set of coefficients are discussed. The first method, referred to as "independent component analysis," is summarized within rectangle 1510 in FIG. 15. In this method, m independent basis metrics are selected from the original metrics in $X^{raw}$ 1512. For the remaining dependent metrics in $X^{raw}$, the dependent metrics can be expressed as linear combinations of the independent basis metrics 1513. In this case, the dimensions of the coefficients matrix 1508 are m by r, where r=s−m. A second method, summarized within rectangle 1516 in FIG. 15, is referred to as "principle component analysis." In this method, a set of m independent basis vectors are determined as linear combinations of the s metrics in $X^{raw}$ 1518 and each metric in $X^{raw}$ is computed as a linear combination of the independent basis metrics 1520. In this case, the dimensions of the coefficients matrix 1508 are m by r, where r=s. This overall approach to compressing high-variability metric data using a set of independent basis metrics and a set of coefficients is referred to as "CpLC."

Figure 16:
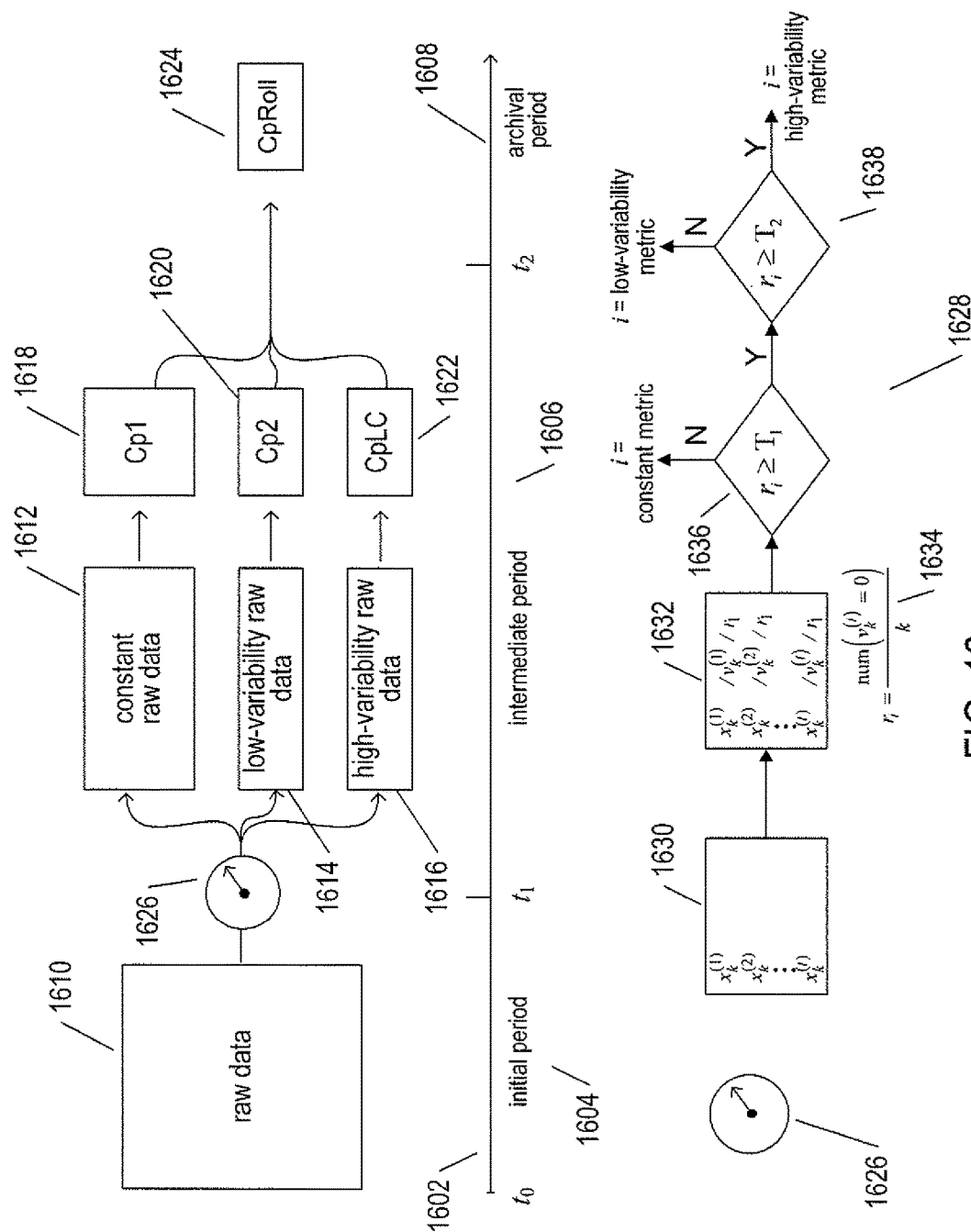
FIG. 16 illustrates a general approach to compressing metric data within a computer system.

FIG. 16 illustrates a general approach to compressing metric data within a computer system. A timeline 1602 is shown in FIG. 16 with three different intervals, including a first initial period 1604, a second intermediate period 1606, and a subsequent, archival period 1608. This describes the time progression of a particular set of metric data, collected over a particular time interval, through different storage states within a computer system. During the initial period, metric data is stored in its raw form 1610. It is stored in its raw form because, during the initial period, the metric data may need to be frequently accessed and processed for various types of monitoring and remediation tasks carried out by automated administration and maintenance subsystems. After the initial period, the data is compressed and stored in compressed form, during the intermediate period 1606. The metric data is partitioned into relatively constant raw data 1612, low-variability raw data 1614, and high-variability raw data 1616. The constant raw data 1612 is compressed using a Cp1 compression technique 1618. The low-variability raw data 1614 is compressed using a Cp2 compression technique 1620. The high-variability raw data 1616 is compressed using a CpLC technique 1622. In many implementations, the initially compressed data may be further compressed using other, additional data-compression techniques. The compressed data stored in the intermediate period can generally be recovered either without any loss in accuracy, having been compressed by a lossless compression method, or with a generally small loss of accuracy, bounded by a threshold accuracy loss, having been compressed by a lossy compression method. In the final archival period 1608, the compressed data is compressed using a CpRoll technique 1624 in which a large number of time-associated values are replaced by one or a few statistically derived metric values, as discussed above. Once compressed using the CpRoll compression, and, in certain implementations, using additional compression, the detailed raw data with variations over small time intervals can no longer be recovered. This final compression is suitable for data that may need to be infrequently accessed only for tasks that require relatively low-accuracy estimates of the original raw data.

The partitioning of the raw data into constant, low-variability, and high-variability raw data, represented by the circled arrow 1626, is illustrated in greater detail in the lower portion of FIG. 16 1628. The initial metrics are received in step 1630. For each metric, a variation sequence and variability ratio are computed in step 1632. The variation sequence $v(t_k)$ is discussed above with reference to FIGS. 12A-B. The variation ratio $r_i$ for metric i is computed 1634 as the ratio of values in the variation sequence equal to 0 divided by the total number of values in the variation sequence. Alternatively, the variation ratio $r_i$ may be computed as the number of values in the variation sequence below a threshold value divided by the total number of values in the variation sequence. When $r_i$ is less than a first threshold $T_1$, the metric is considered to be a constant metric, as determined in step 1636. When the ratio $r_i$ is less than a second threshold $T_2$, as determined in step 1638, the metric i is considered to be a low-variability metric. Otherwise, the metric is considered to be a high-variability metric. There are, of course, additional methods for determining the variability of metric data, including methods that use the familiar statistical metrics, including variance, standard deviation, and coefficient of variance.

Figure 17:
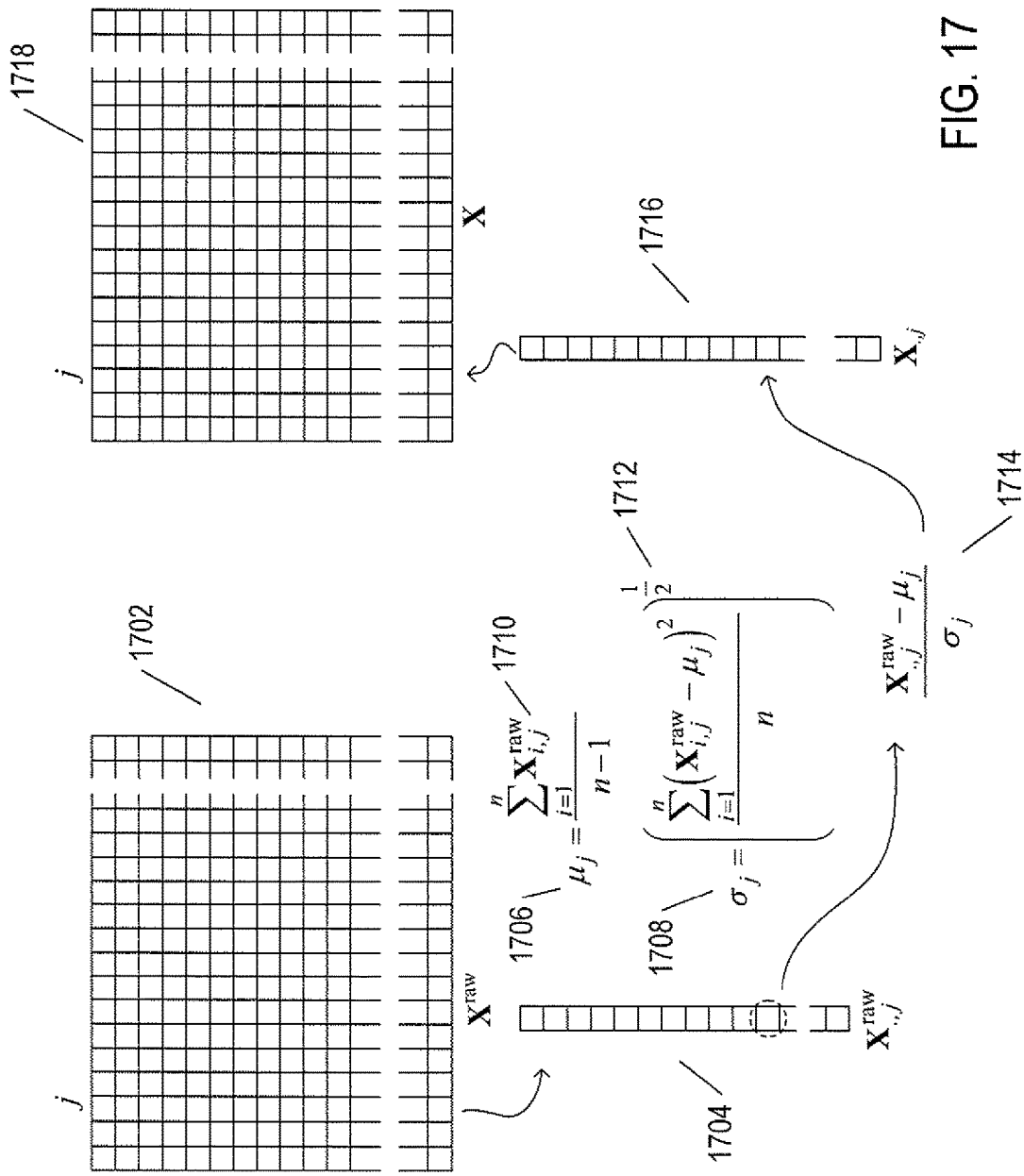
FIG. 17 illustrates a first step undertaken by both the independent component analysis and principle-component-analysis methods for identifying a set of independent, basis metrics.

FIG. 17 illustrates a first step undertaken by both the independent component analysis and principle-component-analysis methods for identifying a set of independent, basis metrics. The input to these methods, as discussed above with reference to FIG. 15, is a metric-data matrix $X^{raw}$ 1702. As discussed above, each column in matrix $X^{raw}$, such as column $X_{,j}^{raw}$ 1704 is a metric containing n numeric values. The mean $\mu_j$ 1706 and the standard deviation $\sigma_j$ are computed for the metric data represented by column $X_{,j}^{raw}$, as indicated by expressions 1710 and 1712. The values in column $X_{,j}^{raw}$ are modified by first subtracting $\mu_j$ and then dividing the result by $\sigma_j$, as indicated by expression 1714. This produces a normalized metric $X_{,j}$ 1716 which becomes column j of the normalized data set $X$ 1718.

Figure 18:
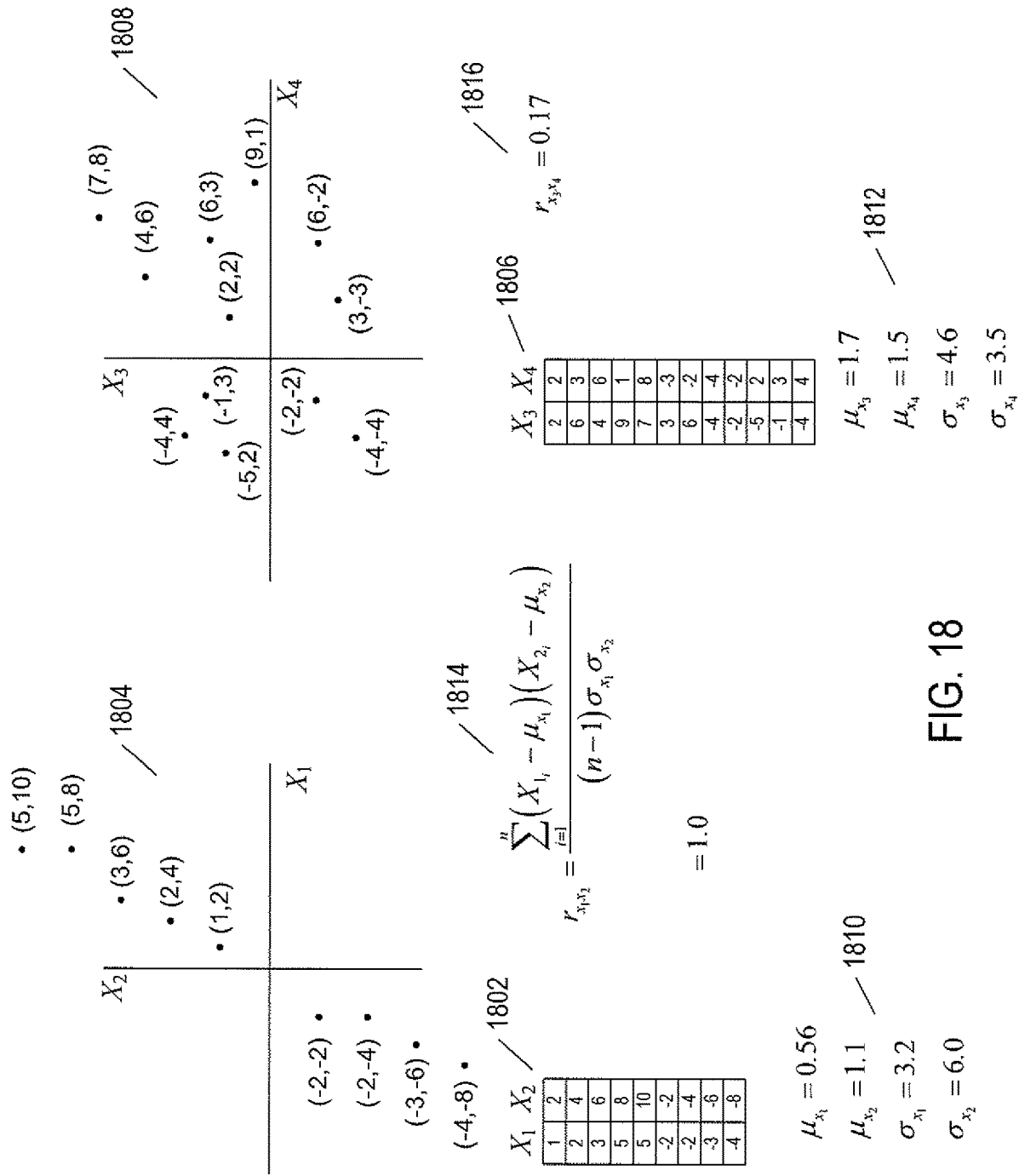
FIG. 18 illustrates the sample correlation coefficient.

FIG. 18 illustrates the sample correlation coefficient. In FIG. 18, the data for two metrics $X_1$ and $X_2$ are shown in tabular form 1802 and plotted in graphical form 1804. Similarly, the data values for two metrics $X_3$ and $X_4$ are shown in tabular form 1806 and plotted in plot 1808. It is apparent, in plot 1804, that the two metrics $X_1$ and $X_2$ are linearly correlated. The plot of pairs of numeric values from the two metrics is roughly linear. By contrast, metrics $X_3$ and $X_4$ appear to be uncorrelated, since there is no apparent trend or pattern in a plot of the data points. The means and standard deviations for metrics $X_1$ and $X_2$ 1810 and for metrics $X_3$ and $X_4$ 1812 are computed and shown below tables 1802 and 1806, respectively. These values are used to compute a correlation coefficient $r_{x_1,x_2}$ for metrics $X_1$ and $X_2$ according to expression 1814 and to compute a correlation coefficient $r_{x_3,x_4}$ for the metrics $X_3$ and $X_4$ 1816. For the positively linearly correlated pair of metrics $X_1$ and $X_2$, the computed correlation coefficient is 1.0. For the apparently uncorrelated or weekly correlated metrics $X_3$ and $X_4$, the correlation coefficient has a value 0.17. In general, the correlation coefficient has the value 1.0 for positively linearly related metrics having a positive slope when plotted in a two-dimensional plot, such as plot 1804, and has a value −1.0 for negatively linearly related metrics. The correlation coefficient tends to 0 as the two metrics become increasingly linearly uncorrelated. A correlation matrix P of dimension s by s can be computed from a normalized metric-data matrix X by computing the correlation coefficient for each possible pair of columns in a normalized data matrix X. In other words, an element in the correlation matrix P, $P_{i,j}$, stores the correlation coefficient for metrics i and j corresponding to columns $X_i$ and $X_j$. The correlation matrix is computed both as an intermediate step by the independent-component-analysis method as well as the principle-component-analysis method.

Figure 19:
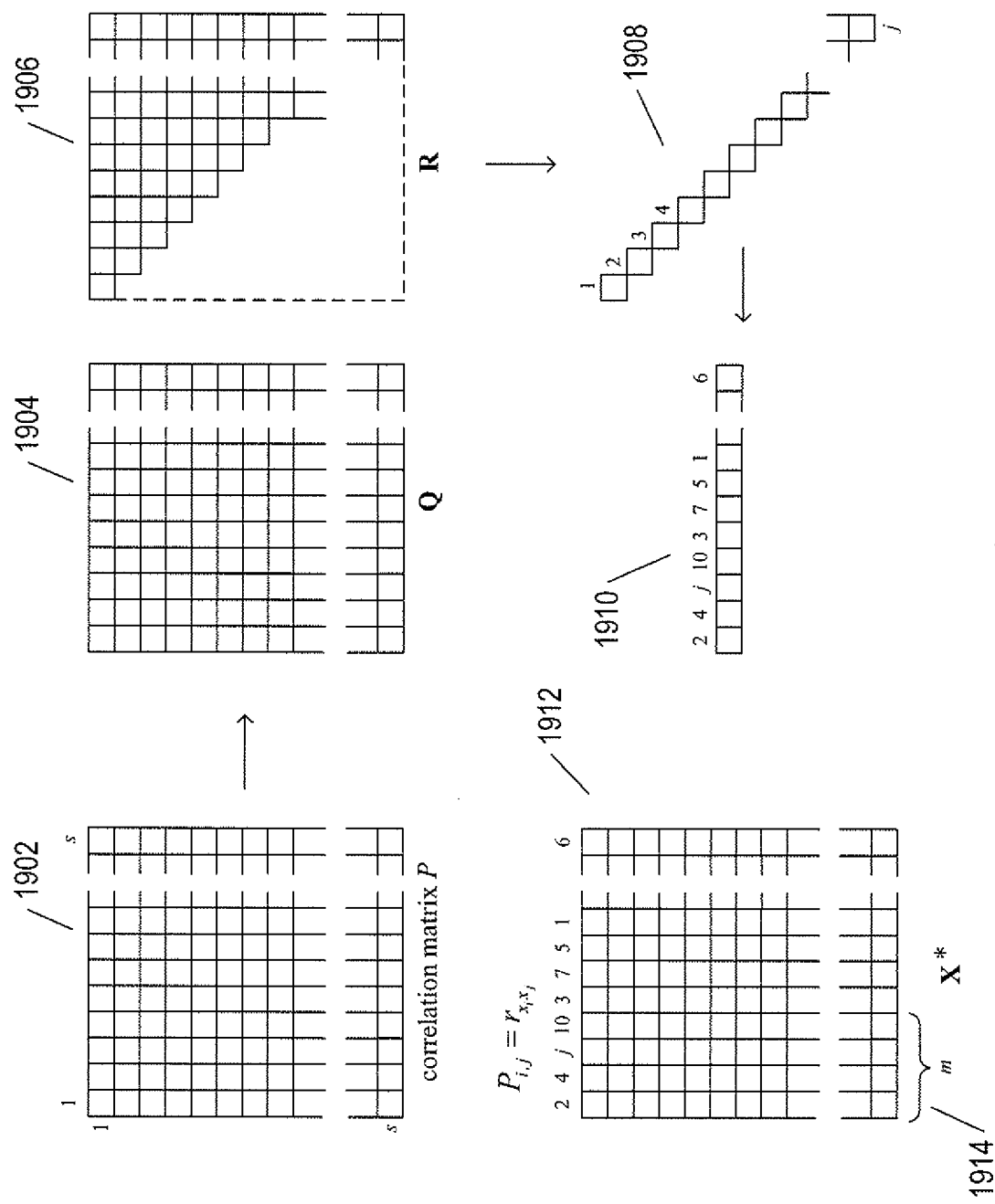
FIGS. 19-21 illustrate the independent-component-analysis method for determining a set of independent basis metrics.
Figure 20:
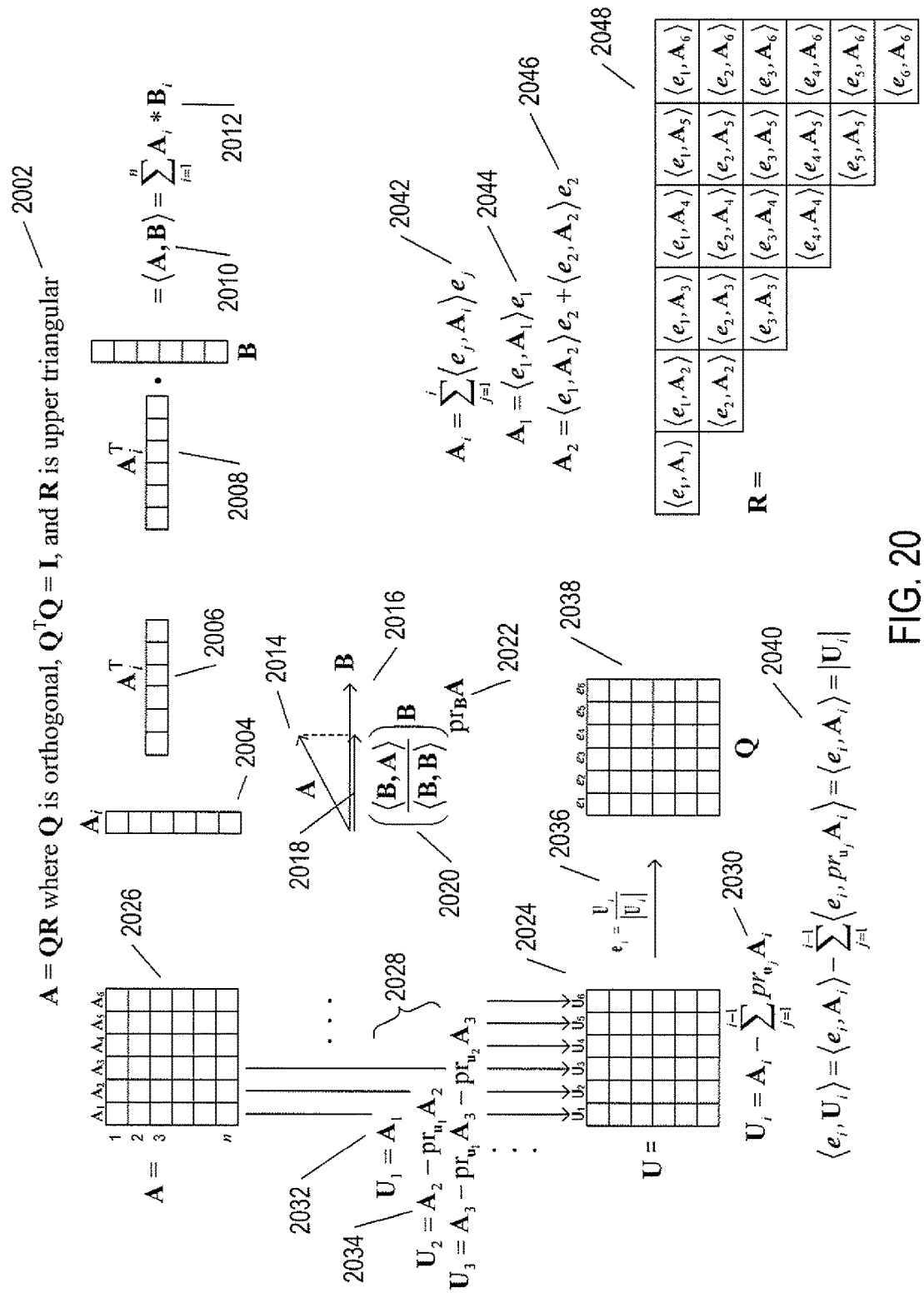
Figure 21:
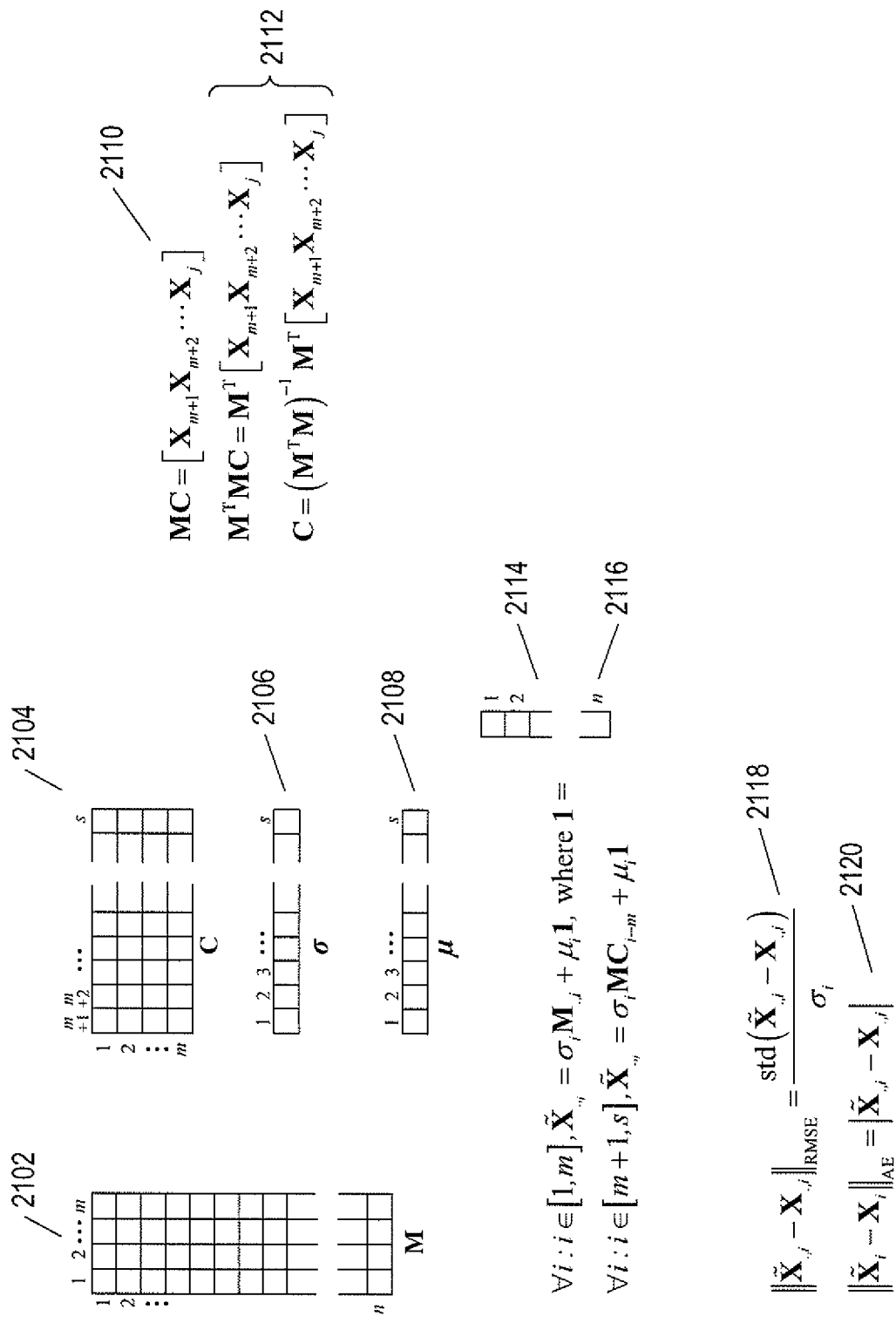

FIGS. 19-21 illustrate the independent-component-analysis method for determining a set of independent basis metrics. This approach starts with the correlation matrix P discussed above with reference to FIG. 18. As shown in FIG. 19, the independent-component-analysis method partitions the correlation matrix P 1902 into two matrices Q 1904 and R 1906. The matrix Q is an orthogonal matrix. The matrix R is an upper-triangular matrix. This partitioning is accomplished using the QR decomposition method, discussed below with reference to FIG. 20. The diagonal elements of the matrix R 1908 are sorted in descending order by value to generate an array 1910 that serves as a map for reorganizing the columns in the normalized data matrix X to generate a matrix X* 1912. Note that the original indices of the diagonal elements of matrix R are reordered when the elements are sorted by value and the reordered indices constitute a map for correspondingly reordering the columns of data matrix X to produce matrix X*. The first m columns 1914 of matrix X* are selected as the independent basis metrics for the raw data set $X^{raw}$. The magnitude of m is selected in order to represent the non-independent metrics via linear combinations with a greater than a threshold accuracy. In other words, in is the minimum number of basis metrics needed in order to represent the non-independent metrics as linear combinations with an accuracy greater than or equal to a threshold accuracy.

FIG. 20 illustrates the QR-decomposition method used to decompose the correlation matrix P into the matrices Q and R. The QR-decomposition method is based on a theorem 2002 that a given matrix A with real-valued components can be decomposed into matrices Q and R that, when multiplied together by matrix multiplication, generate the matrix A, where matrix $Q^TQ=I$ and where R is upper triangular. In the following discussion, columns of the matrix A, $A_i$ 2004, are considered to be column vectors that can be transposed, using the transposition operation, to corresponding row vectors 2006 $A_i^T$. The dot product 2008 of the transpose of vector A, $A^T$, and vector B, alternatively represented as the inner product of vectors A and B 2010, is computed as the product of the components of the two vectors 2012. Note that this assumes an orthogonal basis. The projection of a vector A 2014 onto a vector B 2016 produces a resultant vector 2018 in the same orientation as vector B but with a length equal to the inner product of B and A divided by the inner product of B and B 2020. The projection operation of a vector A onto a vector B is symbolically represented as $pr_B A$ 2022.

The QR-decomposition method begins with generation of a matrix U 2024 from the matrix A 2026, as indicated by the expressions 2028 in FIG. 20 and by the general expression 2030 in FIG. 20. The first column of the matrix U, $U_1$, is equal to the first column of the matrix A, $A_1$ 2032. The second column of the matrix U, $U_2$, is equal to a result 2034 obtained by subtracting the projection of column $A_2$ onto $U_1$, $pr_{U_1} A_2$ from column $A_2$. Each successive column of the matrix U is computed using one more term than used to compute the previous column, as indicated by the pattern of expressions 2028 and by the general expression 2030. This operation ensures that the columns of the matrix U are orthogonal with respect to one another. The matrix U is then normalized by dividing each column vector by its length 2036 to generate the matrix Q 2038. An expression for the length of a column vector of the matrix U 2040 is provided in the lower portion of FIG. 20. The values of the column vectors of the matrix A can be expressed in terms of the columns of matrix Q by expression 2042. The specific expressions for $A_1$ and $A_2$ 2044 and 2046 are shown below the general expression 2042 to indicate the pattern. This pattern of terms can be used to directly determine the values of matrix R 2048 so that the product QR=A.

FIG. 21 illustrates the high-variability-metric compression method based on the independent-component-analysis method, previously generally described in FIG. 15. Rather than storing the raw data $X^{raw}$, this method stores a set of in independent normalized basis metrics M 2102, a set of in by s-m coefficients C 2104, an array of standard deviations 2106 for columns of $X^{raw}$, and an array of means 2108 for columns of $X^{raw}$. The non-independent normalized columns of X are generated by multiplying matrices M and C 2110. The coefficients stored in matrix C can be computed by a least-squares process represented by expressions 2112. The estimated raw metrics corresponding to the independent basis metrics can be recovered by multiplying the corresponding basis metric by the standard deviation for the metric and then adding a vector of elements equal to the mean for the metric, as shown in expression 2114. The non-independent normalized metrics can be recovered by multiplying matrix M with vector $C_{i-m}$, as shown in expression 2116. The notation $\tilde{X}_{,i}^{raw}$ is used to represent the recovered columns corresponding to the original metrics $X_{,i}^{raw}$ Several different error values 2118 and 2120 can be computed from $X_{,i}$ and $\tilde{X}_{,i}$. One or more of these error values are used to select the number of basis metrics m so that the accuracy of recovery of estimated raw metrics from the compressed data does not fall below a threshold value.

Figure 22:
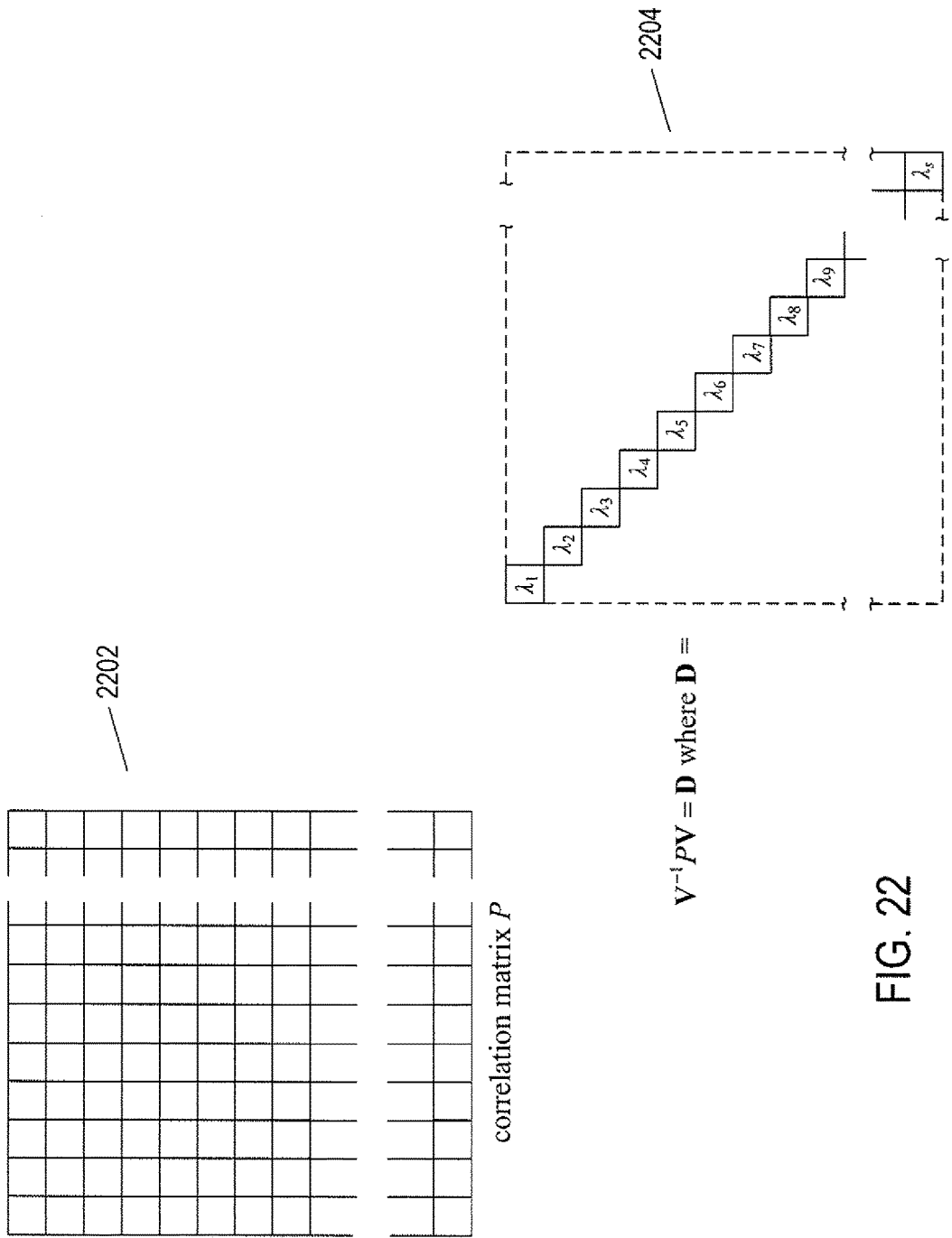

FIGS. 22-24 illustrate the principle-component-analysis method for determining a set of basis vectors. As shown in FIG. 22, the principle-component-analysis method begins with the correlation matrix P 2202, discussed above with reference to FIGS. 18 and 19. In this method, a matrix of Eigen vectors V is determined. Multiplication of the correlation matrix P on the right by V and on the left by $V^{-1}$ produces a diagonal matrix D that contains the Eigen values $\lambda_1 - \lambda_s$ corresponding to the Eigen vectors of matrix V, as shown by expression 2204 in FIG. 22.

FIG. 23 illustrates determination of the eigenvalues and eigenvectors of the covariance matrix C. The basic eigenvalue expression 2320 states that an eigenvector v of the covariance matrix C multiplied with the covariance matrix C is equal to the product of a scalar value $\lambda$ and the eigenvector v. This equation can be rearranged, as shown in the pair of equations 2322, to show that the product of matrix $(C-\lambda I)$ and the eigenvector v is equal to the all-zeros column vector 0. This expression leads to non-trivial results only when the determinant of the matrix $(C-\lambda I)$ is equal to 0 or, in other words, when the matrix $(C-\lambda I)$ is not invertible. The expression for the determinate being 0 leads to a polynomial expression in $\lambda$ with n roots 2324. Solving of this polynomial expression leads to the eigenvalues of the covariance matrix. With these eigenvalues determined, expression 2320 can be used to find the eigenvectors of the covariance matrix $v_1, v_2, \ldots, v_j$ using the eigenvalue equation 2320. The eigenvectors can then be combined together to produce the matrix V 2326. The matrix V is then be used to diagonalize the covariance matrix C to produce the diagonal matrix D 2328. The values along the diagonal of matrix D are the eigenvalues of the covariance matrix. These eigenvalues can be rearranged in order of decreasing magnitude, with the corresponding eigenvectors identically rearranged, to produce matrices D' and V' 2330 and 2331.

FIG. 24 illustrates the compression method based on the principle-component-analysis method, previously generally discussed with reference to FIG. 15. Multiplication of the normalized data matrix X by the Eigen vector matrix V' produces matrix P' 2402, as shown by expression 2404. The initial m columns 2406 of the matrix P' are selected as the independent basis metrics and stored in a matrix P 2408. The coefficients are stored in a matrix C 2410 and generated by a least-squares process indicated by expression 2412, similar to the generation of coefficients for the previously discussed method based on independent component analysis and shown in equations 2110 and 2112 in FIG. 21. The standard-deviation and mean arrays 2414 and 2416 are also stored as part of the compressed data. The estimated metric $\tilde{X}_i^{raw}$ is obtained by multiplying together the matrix P with the vector $C_i$, multiplying the result by $\sigma_i$, and adding to the vector results a vector with elements containing $\mu_i$, as indicated by expression 2420. As with the previous method, the number of basis metrics m is selected so that the difference between the recovered metrics and the original raw-data metrics, as computed by any one or more of the various error metrics, falls below a threshold value.

Figure 25A:
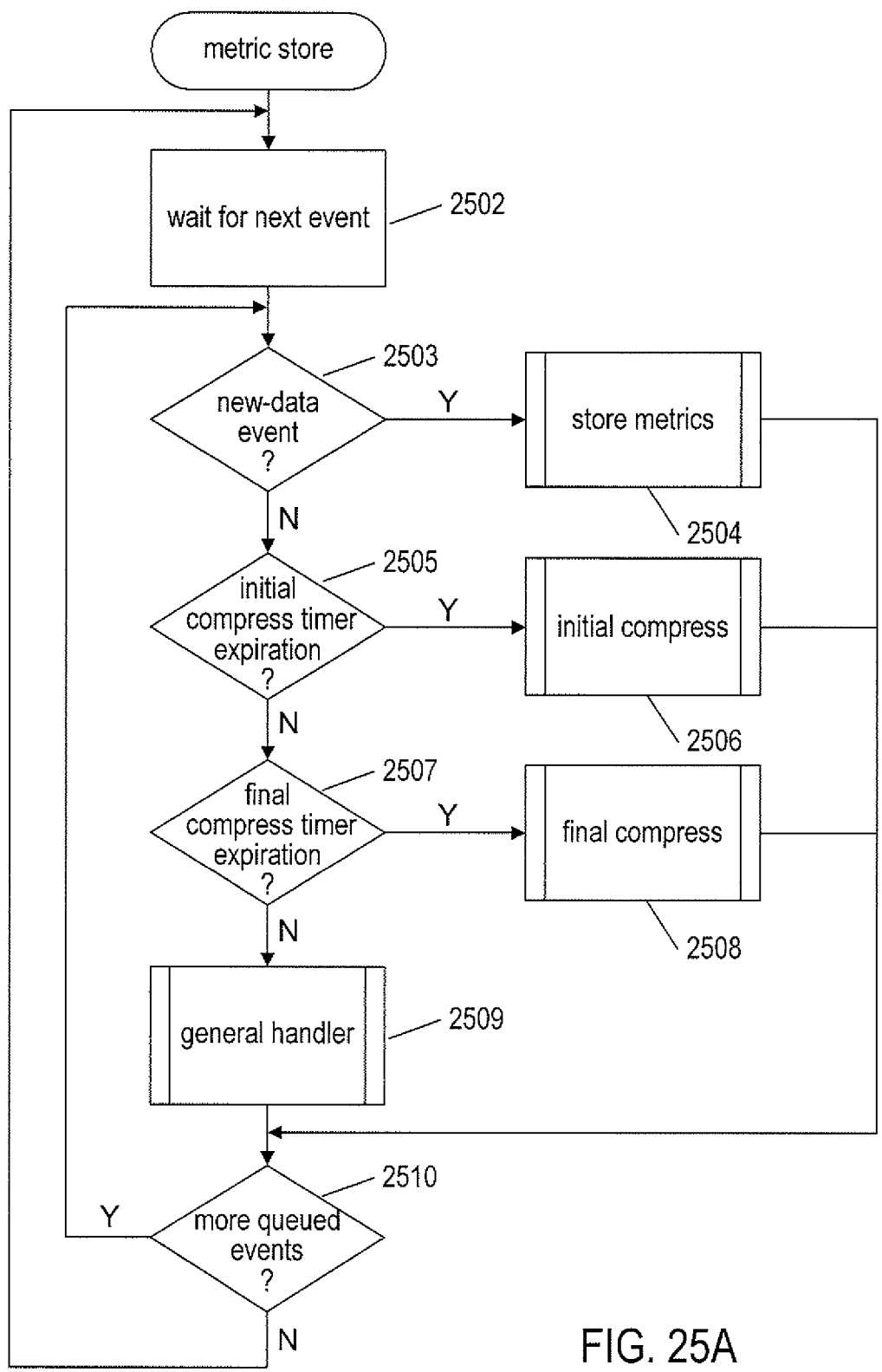
FIGS. 25A-C provide control-flow diagrams for one implementation of the currently disclosed metric-data compression method.
Figure 25B:
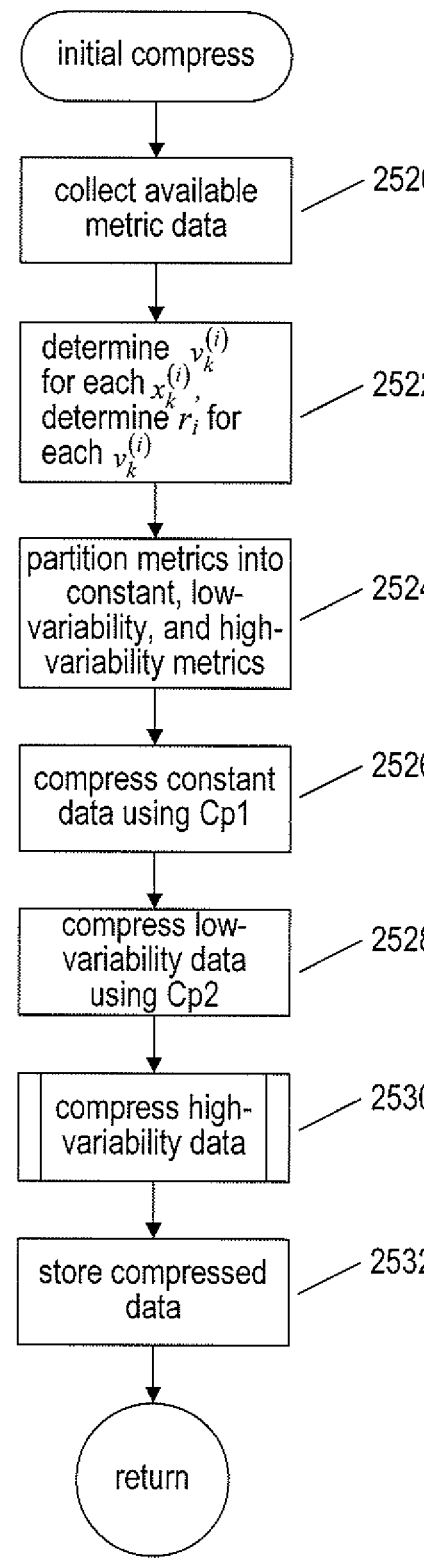
Figure 25C:
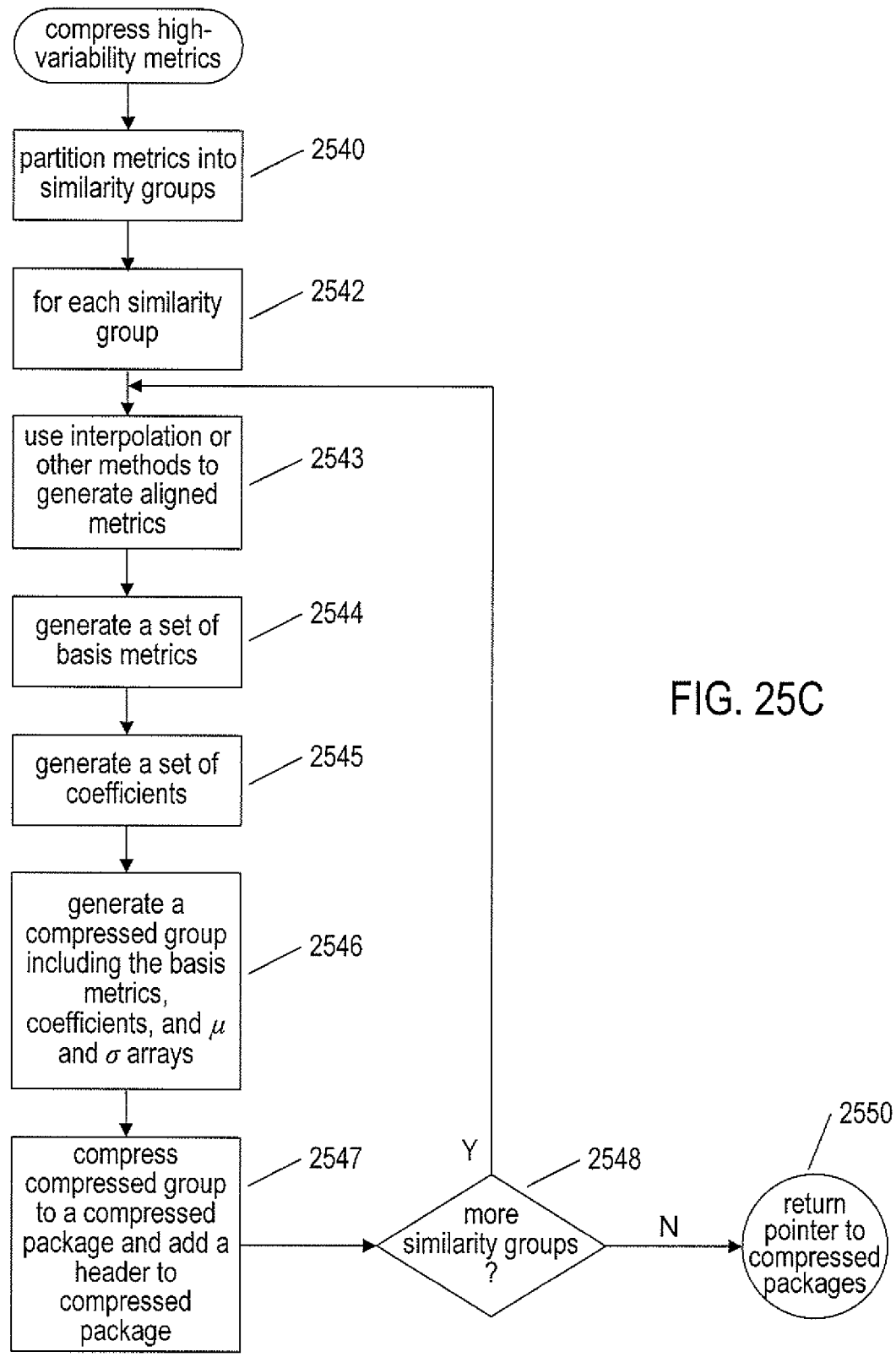

FIGS. 25A-C provide control-flow diagrams for one implementation of the currently disclosed metric-data compression method. FIG. 25A shows an overall control-flow diagram for metric-data compression within a computer system. The overall method is modeled as a continuously executing event loop in which the event loop waits, in step 2502, for a next event to occur and then handles the event. When an event occurs, control flows to step 2503, where the method determines whether the event is a new-data event. When the event is a new-data event, a handler "store metrics" 2504 is called to store the raw data within the system. Otherwise, when the event is an initial-compress-timer expiration event, as determined in step 2505, a handler "initial compress" is called, in step 2506, to carry out the data compression for the intermediate period 1606 previously described with reference to FIG. 16. Otherwise, when the event is a final-compress-timer expiration event, as determined in step 2507, a handler "final compress" is called in step 2508 to compress the data for archival purposes. A general handler 2509 handles other types of events that are beyond the scope of the current discussion. When there are additional queued events, as determined in step 2510, control returns to step 2503. Otherwise, control returns to step 2502 where the method waits for a next event to occur.

FIG. 25B provides a control-flow diagram for the handler "initial compress," called in step 2506 of FIG. 25A. In step 2520, the available raw metric data is collected. In step 2522, the variation sequence is determined for each numeric-value sequence corresponding to a metric and the variation ratio $r_i$ is computed for each metric I. In step 2524, these computed variation ratios $r_i$ are used, as previously discussed with reference to FIG. 16, to partition the metric data into constant, low-variability, and high-variability metrics. The constant metrics are compressed using a Cp1 compression method, in step 2526. The low-variability metrics are compressed using a Cp1 compression method, in step 2528. The high-variability metrics are compressed by a call to the routine "compress high-variability data," in step 2530. Finally, in step 2532, any additional secondary compression methods are applied to the compressed data and it is stored within the computer system in data-storage devices.

FIG. 25C provides a control-flow diagram for the routine "compress high-variability metrics" called in step 2530 of FIG. 25B. In step 2540, the metrics are partitioned into similarity groups. In the for-loop of steps 2542-2548, each similarity group is separately compressed. In step 2543, interpolation and other methods are used to generated aligned metrics. In step 2544, a set of basis metrics is obtained by one of the independent-component-analysis and principle-component-analysis methods, or by another, similar method. In step 2545, a set of coefficients is generated using a least-squares process or another coefficient-determination method. In step 2546, a compressed group is generated by including the basis metrics, coefficients, and mean and standard deviation arrays. In step 2547, a compressed package is generated from the compressed group by adding a header to the compressed group that describes the compression methods that were employed, number of metrics compressed, and other such data. Following completion of the for-loop of steps 2542-2548, a pointer is returned to the compressed packages in step 2550. In certain cases, the metrics are compressed together, without partitioning into similarity groups.

Although the present invention has been described in terms of particular embodiments, it is not intended that the invention be limited to these embodiments. Modifications within the spirit of the invention will be apparent to those skilled in the art. For example, and of many different design and implementation parameters can be varied to produce alternative implementations, including choice of hardware platforms, operating systems, virtualization technologies, programming language, data structures, control structures, modular organizations, and other such design and implementation parameters. As discussed above, additional methods may be used to identify a set of basis metrics, and a variety of different compression methods may be employed, alone or in combination, for compressing constant, near-constant, and low-variability metric data as well as compressing already compressed metric data to further compress the already-compressed metric data for storage.

It is appreciated that the previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A metric-data compression subsystem within a computer system that includes one or more processors, one or more memories, and one or more data-storage devices, the metric-data compression subsystem comprising:
   a first compression component that compresses constant and near-constant metric data;
   a second compression component that compresses low-variability metric data;
   a third compression component that compresses high-variability metric data using a basis-metric-and-coefficient method; and
   a processing component that processes metric data by
      storing, in one or more data-storage devices, initially received metric data in raw form during an initial period, and
      compressing previously stored metric data, during an intermediate period, by compressing constant and near-constant metric data using the first compression component, compressing low-variability metric data using the second compression component, compressing high-variability metric data using the third compression component, and storing the compressed data in one or more data-storage devices.

2. The metric-data compression subsystem of claim 1 wherein the processing component
   compresses previously compressed data, during a final, archival period, using a lossy, statistical-metric-based compression method that achieves a greater than threshold compression ratio.

3. The metric-data compression subsystem of claim 1 wherein compressing previously stored metric data further comprises:
   for each metric represented by data in to stored data,
      determining a variability ratio,
      when the variability ratio has a value within a first interval, classifying the metric as associated with constant or near-constant data and compressing the data associated with the metric using the first compression component,
      when the variability ratio has a value within a second interval, classifying the metric as associated with low-variability data and compressing the data associated with the metric using the second compression component, and
when the variability ratio has a value within a third interval, classifying the metric as associated with high-variability data and compressing the data associated with the metric using the third compression component.

4. The metric-data compression subsystem of claim 3 wherein determining a variability ratio further comprises:
generating a variation function for the data associated with the metric; and
computing the variability ratio as the number of time-associated data points for which the variation function returns a value 0 to the total number of time-associated data points.

5. The metric-data compression subsystem of claim 3 wherein determining a variability ratio further comprises:
generating a variation function for the data associated with the metric; and
computing the variability ratio as the number of time-associated data points for which the variation function returns a value less than a threshold value to the total number of time-associated data points.

6. The metric-data compression subsystem of claim 1 wherein the basis-metric-and-coefficient method used by the third compression component compresses high-variability metric data by:
determining a set of independent basis metrics for the metrics associated with high-variability data;
determining a set of coefficients with which each non-basis metric associated with high-variability data is expressed as a linear combination of terms, each term comprising a coefficient multiplied by a basis metric; and
storing the set of independent basis metrics and the set of coefficients as the compressed high-variability metric data.

7. The metric-data compression subsystem of claim 6 wherein each metric is a set of data points, each data point comprising a time-associated data value.

8. The metric-data compression subsystem of claim 6 wherein determining a set of independent basis metrics for the metrics associated with high-variability data further comprises:
generating a set of normalized metrics by
for each metric,
determining a mean and standard deviation, and
generating a normalized metric by
for each data point associated with the metric, generating a normalized data point metric by subtracting the mean from the data value and dividing the result by the standard deviation, and
including the normalized data point in the normalized metric, and
including the normalized metric in the set of normalized metrics;
computing a set of correlation coefficients for each pair of normalized metrics; and
using the set of correlation coefficients to select a set of independent basis metrics.

9. The metric-data compression subsystem of claim 8 wherein using the correlation matrix to select a set of independent basis metrics further comprises:
using a QR-decomposition method to generate, from the set of correlation coefficients, a first set of unit metrics that are mutually orthogonal and a second set of multipliers that, when applied to the first set of unit metrics, recover the set of correlation coefficients;
sorting a subset of the multipliers in the second set of multipliers by value;
using indexes of the sorted subset of the multipliers to sort the set of normalized metrics; and
selecting, as the independent basis metrics, a first subset of normalized metrics from the sorted set of normalized metrics.

10. The metric-data compression subsystem of claim 9 wherein selecting, as the independent basis metrics, a first subset of normalized metrics from the sorted set of normalized metrics further comprises:
selecting a minimum number of the initial normalized metrics from the sorted set of normalized metrics, using which the remaining normalized metrics can be represented by linear combinations of the selected a minimum number of the initial normalized metrics from the sorted set of normalized metrics and regenerated from the representations at a greater than threshold accuracy.

11. The metric-data compression subsystem of claim 10 wherein selecting, as the independent basis metrics, a first subset of the new metrics from the new metrics further comprises:
selecting a minimum number of the new metrics from the set of new metrics, using which the normalized metrics can be represented by linear combinations of the selected minimum number of the new metrics from the set of new metrics and regenerated from the representations at a greater than threshold accuracy.

12. The metric-data compression subsystem of claim 10 wherein selecting, as the independent basis metrics, a first subset of the new metrics from the new metrics further comprises:
selecting a minimum number of the new metrics from the set of new metrics, using which the normalized metrics can be represented by linear combinations of the selected minimum number of the new metrics from the set of new metrics and regenerated from the representations at a greater than threshold accuracy.

13. The metric-data compression subsystem of claim 8 wherein using the correlation matrix to select a set of independent basis metrics further comprises:
identifying a set of eigenvectors and eigenvalues for the set of correlation coefficients;
sorting the eigenvalues by value;
correspondingly sorting the eigenvectors;
using the eigenvectors to generate a set of new metrics; and
selecting, as the independent basis metrics, a first subset of the new metrics from the new metrics.

14. The metric-data compression subsystem of claim 6 further including:
storing the means and standard deviations computed for the data associated with each of the metrics; and
storing one or more additional parameters that described the number of metrics compressed and additional information needed to recover estimates of the original data from the stored basis metrics and coefficients.

15. A method that compresses metric data within a computer system that includes one or more processors, one or more memories, and one or more data-storage devices, the metric-data comprising a set of data points associated with each of multiple metrics, each data point comprising a time-associated data value, the method comprising:

determining a set of independent basis metrics for the metrics;

determining a set of coefficients with which each non-basis metric is expressed as a linear combination of terms, each term comprising a coefficient multiplied by a basis metric; and storing the set of independent basis metrics, the set of coefficients, and a set of statistical metrics as the compressed metric data.

16. The method of claim 15 wherein determining a set of independent basis metrics for the metrics further comprises:

generating a set of normalized metrics by for each metric, determining a mean and standard deviation that together constitute statistical metrics associated with the metric, and generating a normalized metric by for each data point associated with the metric, generating a normalized data point metric by subtracting the mean from the data value and dividing the result by the standard deviation, and including the normalized data point in the normalized metric, and including the normalized metric in the set of normalized metrics;

computing a set of correlation coefficients for each pair of normalized metrics; and using the set of correlation coefficients to select a set of independent basis metrics.

17. The method of claim 16 wherein using the correlation matrix to select a set of independent basis metrics further comprises:

using a QR-decomposition method to generate, from the set of correlation coefficients, a first set of unit metrics that are mutually orthogonal and a second set of multipliers that, when applied to the first set of unit metrics, recover the set of correlation coefficients;

sorting a subset of the multipliers in the second set of multipliers by value;

using indexes of the sorted subset of the multipliers to sort the set of normalized metrics; and selecting, as the independent basis metrics, a first subset of normalized metrics from the sorted set of normalized metrics.

18. The method of claim 17 wherein selecting, as the independent basis metrics, a first subset of normalized metrics from the sorted set of normalized metrics further comprises:

selecting a minimum number of the initial normalized metrics from the sorted set of normalized metrics, using which the remaining normalized metrics can be represented by linear combinations of the selected a minimum number of the initial normalized metrics from the sorted set of normalized metrics and regenerated from the representations at a greater than threshold accuracy.

19. The metric-data compression subsystem of claim 16 wherein using the correlation matrix to select a set of independent basis metrics further comprises:

identifying a set of eigenvectors and eigenvalues for the set of correlation coefficients;

sorting the eigenvalues by value;

correspondingly sorting the eigenvectors;

using the eigenvectors to generate a set of new metrics; and selecting, as the independent basis metrics, a first subset of the new metrics from the new metrics.

20. Computer instructions, stored within a physical data-storage device, that, when executed by one or more processors of a computer system that includes the one or more processors, one or more memories, and one or more data-storage devices, control the computer system to compress metric data comprising a set of data points associated with each of multiple metrics, each data point comprising a time-associated data value, by:

determining a set of independent basis metrics for the metrics;

determining a set of coefficients with which each non-basis metric is expressed as a linear combination of terms, each term comprising a coefficient multiplied by a basis metric; and storing the set of independent basis metrics, the set of coefficients, and a set of statistical metrics as the compressed metric data.

* * * * *